(12) United States Patent
Kaneda

(10) Patent No.: US 10,771,050 B2
(45) Date of Patent: Sep. 8, 2020

(54) GATE DRIVING CIRCUIT AND SWITCHING POWER SUPPLY APPARATUS

(71) Applicant: FUJI ELECTRIC CO., LTD., Kanagawa (JP)

(72) Inventor: Hirotoshi Kaneda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/392,622

(22) Filed: Apr. 24, 2019

(65) Prior Publication Data
US 2019/0348979 A1 Nov. 14, 2019

(30) Foreign Application Priority Data
May 9, 2018 (JP) .................................. 2018-090505

(51) Int. Cl.
| | | |
|---|---|---|
| H03K 17/0812 | (2006.01) | |
| H02M 1/08 | (2006.01) | |
| H03K 17/16 | (2006.01) | |
| H02M 1/00 | (2006.01) | |

(52) U.S. Cl.
CPC ........ *H03K 17/08128* (2013.01); *H02M 1/08* (2013.01); *H03K 17/168* (2013.01); *H02M 2001/0054* (2013.01); *H03K 2217/0027* (2013.01)

(58) Field of Classification Search
CPC ................. H03K 17/08; H03K 17/081; H03K 17/08104; H03K 17/08112; H03K 17/08116; H03K 17/0812; H03K 17/08122; H03K 17/08126; H03K 17/08128; H03K 17/16; H03K 17/161; H03K 17/162; H03K 17/168
USPC ................ 327/108–112, 170, 379, 380, 427, 327/430–437; 326/82, 83, 87
See application file for complete search history.

(56) References Cited

U.S. PATENT DOCUMENTS

| | | | | |
|---|---|---|---|---|
| 6,333,665 | B1 | 12/2001 | Ichikawa | |
| 7,570,085 | B2 * | 8/2009 | Ishikawa | ............ H03K 17/0406 327/108 |
| 2007/0200613 | A1 * | 8/2007 | Ishikawa | ............ H03K 17/0406 327/427 |

(Continued)

FOREIGN PATENT DOCUMENTS

| | | | |
|---|---|---|---|
| JP | 3568848 B2 | 9/2004 | |
| JP | 3666843 B2 | 6/2005 | |

(Continued)

*Primary Examiner* — Tomi Skibinski

(57) ABSTRACT

A gate driving circuit that drives a gate of a main switching device is provided, where the gate driving circuit includes: a first resistor connected between a first potential and the gate of the main switching device; a second resistor connected between a second potential being lower than the first potential and the gate of the main switching device; a first switching device connected in series with the first resistor between the first potential and the gate of the main switching device; a second switching device connected in series with the second resistor between the second potential and the gate of the main switching device; and a control circuit that changes at least one resistance value of a resistance value of the first resistor and a resistance value of the second resistor according to a length of an ON period during which the main switching device is turned on.

19 Claims, 17 Drawing Sheets

(56) References Cited

U.S. PATENT DOCUMENTS

2016/0072405 A1    3/2016  Takao

FOREIGN PATENT DOCUMENTS

| JP | 3941309 B2 | 7/2007 |
|----|------------|--------|
| JP | 2016059108 A | 4/2016 |

* cited by examiner

GATE DRIVING CIRCUIT AND SWITCHING POWER SUPPLY APPARATUS

The contents of the following Japanese patent application are incorporated herein by reference:

2018-090505 filed in JP on May 9, 2018.

BACKGROUND

1. Technical Field

The present invention relates to a gate driving circuit and a switching power supply apparatus.

2. Related Art

Conventionally, a gate driving circuit including a gate resistor connected with a switching device is provided with a voltage boosting/dropping means, a delay circuit, a variable resistor or the like on a signal path to a gate (for example, see Patent Documents 1 to 4).

[Patent Document 1] Japanese Patent No. 3941309
[Patent Document 2] Japanese Patent No. 3666843
[Patent Document 3] Japanese Patent No. 3568848
[Patent Document 4] Japanese Patent Application Publication No. 2016-059108

In a conventional gate driving circuit, reductions of switching loss and voltage overshoot cannot be achieved with good balance in a simple configuration.

SUMMARY

To solve the above-described issue, in a first aspect of the present invention, a gate driving circuit that drives a gate of a main switching device is provided. The gate driving circuit may include a first resistor connected between a first potential and the gate of the main switching device. The gate driving circuit may include a second resistor that is connected between a second potential being lower than the first potential and the gate of the main switching device. The gate driving circuit may include a first switching device that is connected in series with the first resistor between the first potential and the gate of the main switching device. The gate driving circuit may include a second switching device that is connected in series with the second resistor between the second potential and the gate of the main switching device. The gate driving circuit may include a control circuit that changes at least one resistance value of a resistance value of the first resistor and a resistance value of the second resistor according to a length of an ON period during which the main switching device is turned on.

The control circuit may set the resistance value of the second resistor to be larger when the ON period is a first period than when the ON period is a second period that is shorter than the first period.

The control circuit may set the resistance value of the first resistor to be smaller when the ON period is a third period than when the ON period is a fourth period that is shorter than the third period.

At least one of the first resistor and the second resistor may be a voltage-controlled resistor having a resistance value that is continuously changeable according to an input voltage. The control circuit may supply a voltage that causes the resistance value to be large to the voltage-controlled resistor as the ON period is longer within a predetermined range.

The voltage-controlled resistor may have a field effect transistor that changes a resistance value between two main terminals according to a voltage input to a control terminal.

The control circuit may control a first switching device and a second switching device according to an input control signal. The control circuit may determine a length of the ON period according to a length of a specified period during which the main switching device is turned on by the control signal.

The control circuit may set at least one resistance value during a current ON period according to the length of a previous or former ON period.

The control signal may specify the ON period by a pulse. The control circuit may set at least one resistance value according to a width of the pulse.

In a second aspect of the present invention, gate driving circuit that drives a gate of a main switching device is provided. The gate driving circuit may include a first resistor that is connected between a first potential and the gate of the main switching device. The gate driving circuit may include a second resistor that is connected between a second potential being lower than the first potential and the gate of the main switching device. The gate driving circuit may include a first switching device that is connected in series with the first resistor between the first potential and the gate of the main switching device. The gate driving circuit may include a second switching device that is connected in series with the second resistor between the second potential and the gate of the main switching device. The gate driving circuit may include a detecting section that detects a magnitude of measurement target current including current that flows through the main switching device during a period during which the main switching device is turned on. The gate driving circuit may include a control circuit that changes at least one resistance value of a resistance value of the first resistor and a resistance value of the second resistor according to the detected magnitude of the measurement target current.

The control circuit may set the resistance value of the second resistor to be larger when the detected magnitude of the measurement target current is a first magnitude than when the detected magnitude of the measurement target current is a second magnitude that is smaller than the first magnitude.

The control circuit may set the resistance value of the first resistor to be smaller when the detected magnitude of the measurement target current is a third magnitude than when the detected magnitude of the measurement target current is a fourth magnitude that is smaller than the third magnitude.

The detecting section may sample the magnitude of the measurement target current at a predetermined timing during the period during which the main switching device is turned on.

In a third aspect of the present invention, a gate driving circuit that drives of a gate of a main switching device is provided. The gate driving circuit may include a first resistor that is connected between a first potential and the gate of the main switching device. The gate driving circuit may include a second resistor that is connected between a second potential being lower than the first potential and the gate of the main switching device. The gate driving circuit may include a first switching device that is connected in series with the first resistor between the first potential and the gate of the main switching device. The gate driving circuit may include a second switching device that is connected in series with the second resistor between the second potential and the gate of the main switching device. The gate driving circuit may include a detecting section that detects a magnitude of measurement target current including current that flows through the main switching device during a period during which the main switching device is turned on, and a magnitude of opposite measurement target current including current that flows from a negative-side main terminal side toward a positive-side main terminal side of an opposite switching device connected in series with the main switching device during a period during which the main switching device is turned off. The gate driving circuit may include a control circuit that changes the resistance value of the second resistor according to the detected magnitude of the measurement target current, and changes the resistance value of the first resistor according to the detected magnitude of the opposite measurement target current.

In a fourth aspect of the present invention, a gate driving circuit that drives a gate of a main switching device is provided. The gate driving circuit may include a first resistor that is connected between a first potential and the gate of the main switching device. The gate driving circuit may include a second resistor that is connected between a second potential being lower than the first potential and the gate of the main switching device. The gate driving circuit may include a first switching device that is connected in series with the first resistor between the first potential and the gate of the main switching device. The gate driving circuit may include a second switching device that is connected in series with the second resistor between the second potential and the gate of the main switching device. The gate driving circuit may include a detecting section that detects a magnitude of opposite measurement target current including current that flows from a negative-side main terminal side toward a positive-side main terminal side of an opposite switching device that is connected in series with the main switching device during a period during which the main switching device is turned off. The gate driving circuit may include a control circuit that changes a resistance value of a first resistor according to the magnitude of the opposite measurement target current.

The control circuit may set the resistance value of the first resistor to be smaller when the detected magnitude of the opposite measurement target current is a third magnitude the resistance value of the first resistor than when the detected magnitude of the opposite measurement target current is a fourth magnitude that is smaller than the third magnitude.

The detecting section may sample the magnitude of the opposite measurement target current at a predetermined timing during the period during which the opposite switching device is turned on.

In a fifth aspect of the present invention, a switching power supply apparatus is provided. The switching power supply apparatus may include the gate driving circuit according to any one of the first to fourth aspects. The switching power supply apparatus may include the main switching device. The switching power supply apparatus may include a freewheeling diode that is connected with the main switching device in anti-parallel.

The summary clause does not necessarily describe all necessary features of the embodiments of the present invention. The present invention may also be a sub-combination of the features described above.

BRIEF DESCRIPTION OF THE DRAWINGS

FIG. 10 shows the voltage and the current during a period during which the main switching device 2 is turned on.
FIG. 11 shows the voltage and the current at the time of reverse recovery of the freewheeling diode 4 during a period during which the opposite switching device 1 is turned on.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention. Note that through all embodiments, the same reference signs are given to common configurations, and redundant descriptions are omitted.

1. First Embodiment

Figure 1:
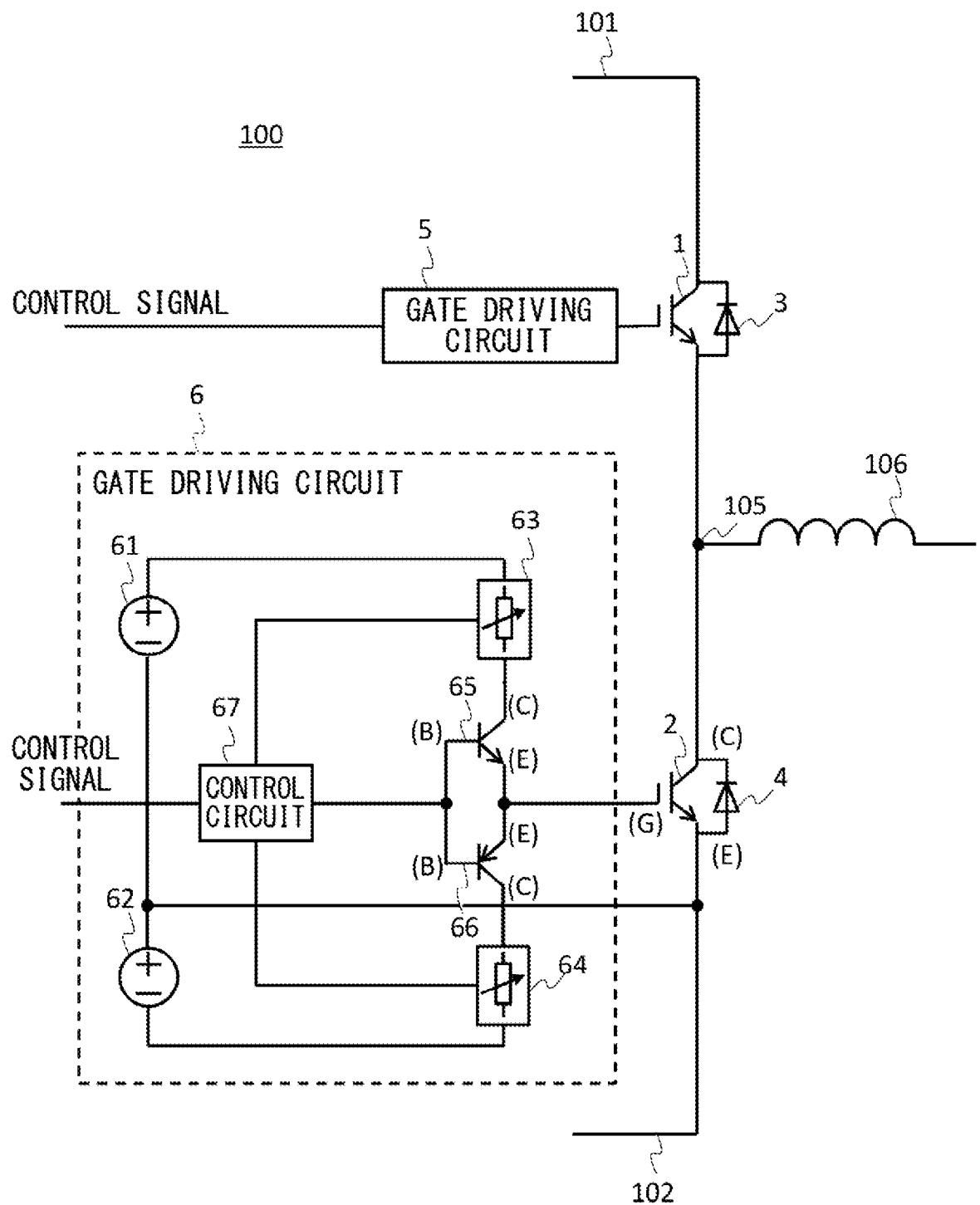
FIG. 1 shows a switching power supply apparatus 100 according to a first embodiment.

FIG. 1 shows a switching power supply apparatus 100 according to a first embodiment. The switching power supply apparatus 100 shows, as one example, one phase of a power conversion apparatus used for driving a motor or for supplying electric power, and switches a connection between a power supply output terminal 105 and a positive-side power line 101 to/from a connection between the power supply output terminal 105 and a negative-side power line 102 to output a converted voltage from the power supply output terminal 105. Also, the switching power supply apparatus 100 in the present embodiment reduces the voltage overshoot and/or the loss at the time of switching by utilizing a correlation between a length of an ON period during which a switching device is turned on and an instantaneous value of current that flows through the switching device at an ending time point of the ON period. Here, a DC voltage of 600 to 800 V, for example, may be applied between the Positive-side power line 101 and the negative-side power line 102. Also, an induction load 106 may be connected with the power supply output terminal 105. The switching power supply apparatus 100 includes a positive-side main switching device 1, a negative-side main switching device 2, freewheeling diodes 3, 4 connected with the main switching devices 1,2 in anti-parallel, a positive-side gate driving circuit 5 and a negative-side gate driving circuit 6.

1-1. Main Switching Device

The main switching devices 1, 2 are subsequently connected in series with each other between the negative-side power line 102 and the Positive-side power line 101. For example, each of the main switching devices 1, 2 has a collector terminal that is connected with the Positive-side power line 101 side and an emitter terminal that is connected with the negative-side power line 102 side. The power supply output terminal 105 may be connected with a middle point between the main switching device 1 and the main switching device 2.

The main switching devices 1, 2 are switched between on/off by gate driving circuits 5, 6 described below. As one example, the main switching devices 1, 2 respectively constitute an upper arm and a lower arm in the power conversion apparatus.

The main switching devices 1, 2 are silicon semiconductor devices using silicon as a base material. Instead of this, at least one of the main switching devices 1, 2 may also be a wide band gap semiconductor device. The wide band gap semiconductor device means a semiconductor device having a larger band gap than that of a silicon semiconductor device, where the semiconductor device includes SiC, GaN, diamond, a gallium nitride-based material, a gallium oxide-based material, AlN, AlGaN, ZnO or the like, for example. The wide band gap semiconductor device can more improve a switching speed than the silicon semiconductor device. Note that in the present embodiment, the main switching devices 1, 2 are IGBTs, and may have a parasitic diode (not shown in the drawings) that has a cathode near the positive-side power line 101. The main switching devices 1, 2 may also be a semiconductor device having another structure, such as a MOSFET or a bipolar transistor.

1-2. Freewheeling Diode

The freewheeling diodes 3, 4 are respectively connected with the main switching devices 1, 2 in anti-parallel such that the cathode thereof is near the positive-side power line 101. The freewheeling diodes 3, 4 may also be a Schottky barrier diode. The freewheeling diodes 3, 4 may also be a silicon semiconductor device and may also be a wide band gap semiconductor device.

1-3. Gate Driving Circuit

The gate driving circuits 5, 6 drive the gates of the corresponding main switching devices 1, 2 based on a turning-on signal and a turning-off signal included in a control signal that is input from the outside. Here, the control signal is supplied from a signal source that is not shown in the drawings, and causes the main switching devices 1, 2 to carry out switching in a synchronous rectification manner. For example, the control signal is set such that either one of the main switching devices 1, 2 is (as one example, alternately) in a connected state with a dead time interposed, where the dead time is a period during which both of the main switching devices 1, 2 are turned off. The control signal may control the main switching devices 1, 2 by PWM control. Note that in the present embodiment, as one example, the control signal specifies that the main switching device 2 is turned on in a case of HIGH and specifies that the main switching device 2 is turned off in a case of LOW. A switching target of the positive-side gate driving circuit 5 is the main switching device 1, and a switching target of the negative-side gate driving circuit 6 is the main switching device 2. Note that because the gate driving circuits 5, 6 have similar structures, in the present embodiment, the negative-side gate driving circuit 6 is described and a description of the positive-side gate driving circuit 5 is omitted.

The gate driving circuit 6 has a first power supply 61 and a second power supply 62, a first resistor 63 and a second resistor 64, a first switching device 65 and a second switching device 66, and a control circuit 67. The first power supply 61 and the second power supply 62 may also be provided outside the gate driving circuit 6.

1-3-1. First Power Supply and Second Power Supply

The first power supply 61 and the second power supply 62 supply a DC voltage to the gate driving circuit 6. In the present embodiment, the first power supply 61 has a first potential on one end (an upper end in the drawings) of the first resistor 63, and the second power supply 62 has a second potential lower than the first potential on the other end (a lower end in the drawings) of the second resistor 64. The first power supply 61 and the second power supply 62 may be connected in series with each other, and the middle point between the first power supply 61 and the second power supply 62 may be connected with an emitter terminal of the main switching device 2.

1-3-2. First Resistor and Second Resistor

The first resistor 63 and the second resistor 64 are gate resistors connected with the gate of the main switching device 2. Each of the first resistor 63 and the second resistor 64 may be a variable resistor, and is a voltage-controlled resistor having a resistance value that is continuously changeable according to an input voltage in the present embodiment, as one example. Of these, the first resistor 63 is connected between the first power supply 61 and the gate of the main switching device 2. The second resistor 64 is connected between the second power supply 62 and the gate of the main switching device 2. Note that although it is omitted in the drawings, the voltage-controlled resistor may have a field effect transistor that changes a resistance value between two main terminals according to a voltage input to a control terminal. Accordingly, the resistance values of the first resistor 63 and the second resistor 64 can be controlled by a simple configuration. The field effect transistor may also be a MOSFET and may also be a Junction FET (JEFT).

1-3-3. First Switching Device and Second Switching Device

The first switching device 65 is connected in series with the first resistor 63 between the first power supply 61 and the gate of the main switching device 2. Accordingly, as the first switching device 65 is turned on and current flows through the first resistor 63, the main switching device 2 is turned on. In the present embodiment, as one example, the first switching device 65 is an NPN type bipolar transistor, and has a collector terminal connected with the first power supply 61 side, an emitter terminal connected with the gate side of the main switching device 2, and a base terminal connected with the control circuit 67 side. Note that the first switching device 65 may also be a semiconductor device having another structure, such as a MOSFET or an IGBT. Also, in the present embodiment, although the first switching device 65 is arranged closer to the main switching device 2 than the first resistor 63, the first switching device 65 may also be arranged closer to the first power supply 61 than the first resistor 63.

The second switching device 66 is connected in series with the second resistor 64 between the second power supply 62 and the gate of the main switching device 2. Accordingly, as the second switching device 66 is turned on and current flows through the second resistor 64, the main switching device 2 is turned off. In the present embodiment, as one example, the second switching device 66 is a PNP type bipolar transistor, and has a collector terminal connected with the second power supply 62 side, an emitter terminal connected with the gate side of the main switching device 2 and a base terminal connected with the control circuit 67 side. Note that the second switching device 66 may also be a semiconductor device having another structure, such as a MOSFET or an IGBT. Also, in the present embodiment, although the second switching device 66 is arranged closer to the main switching device 2 than the second resistor 64, the second switching device 66 may also be arranged closer to the second power supply 62 than the second resistor 64.

A freewheeling diode (not shown in the drawings) having a cathode near the first power supply 61 may be connected with each of the first switching device 65 and the second switching device 66 in parallel. The freewheeling diode may also be built in the first switching device 65 and the second switching device 66, and may also be externally mounted on the first switching device 65 and the second switching device 66.

1-3-4. Control Circuit

The control circuit 67 controls the first switching device 65 and the second switching device 66 according to the input control signal. In the present embodiment, as one example, the control circuit 67 is respectively connected with the base terminal of the first switching device 65 and to the base terminal of the second switching device 66.

Also, the control circuit 67 respectively changes the resistance values of the first resistor 63 and the second resistor 64. The control circuit 67 may change the resistance value so as to improve the switching loss and/or the voltage overshoot during the period during which the main switching device 2 carries out switching. As one example, the control circuit 67 may increase the switching loss while reducing the voltage overshoot to the extent that the breakdown of the devices can be prevented.

1-3-4 (1). Control of Second Resistor

The control circuit 67 may change the resistance value of the second resistor 64 according to the length of the ON period of the main switching device 2. The control circuit 67 may set the resistance value of the second resistor 64 to be larger when the ON period of the main switching device 2 is a first period than when the ON period of the main switching device 2 is a second period being shorter than the first period. As one example, the control circuit 67 supplies a voltage that causes the resistance value of the second resistor 64 to be large to the second resistor 64 as the ON period is longer within a predetermined range (as one example, within a range that is equal to or less than a length of the switching period). Accordingly, the voltage overshoot during the period during which the main switching device 2 is turned off is reduced. Note that the ON period during which the main switching device 2 is turned on means a period during which an ON signal is supplied to the gate of the main switching device 2. The length of the ON period may indicate a positive correlation with an instantaneous value of the current that flows through the main switching device 2 at the ending time point of the ON period, and this is due to inhibition of an abrupt current change by self-induction of an inductance component connected with the power supply output terminal 105. The ON period may be, for example, specified by a pulse of the control signal, and as one example, when a switching frequency is in the order of 1 to 10 kHz, the ON period may be a length of 100 µs to 1000 µs.

The control circuit 67 may set the resistance value of the second resistor 64 during a current ON period according to the length of a previous or former ON period. That setting the resistance value of the second resistor 64 according to the length of the former ON period may be that setting the resistance value based on an average value of the former length of the ON period or a weighted average value, for example. If the ON period is specified by a pulse of the control signal, the control circuit 67 may set a resistance value of the second resistor 64 according to a width of the pulse. Note that if the length of the current ON period is known, the control circuit 67 may also set the resistance value of the second resistor 64 at the ending of the current ON period according to the length of the current ON period. Here, the current ON period means a period from the beginning to the end of an input of the ON signal when the ON signal is input to the main switching device 2 at a current time point, and means a period from the beginning to the end of an input of the next ON signal when the ON signal is not input at the current time point.

The control circuit 67 may determine the length of the ON period according to a length of a specified period during which the main switching device 2 is turned on by the control signal. For example, the control circuit 67 may determine a length of the ON period by counting clock pulses during a period during which the control signal is HIGH. The control circuit 67 may also determine, as the length of the ON period, a time integrated value from the rising to the falling of a voltage of the control signal, the time integrated value acquired by an integrating circuit. In these cases, the control circuit 67 can determine the length of the ON period without receiving a signal that indicates the length of the ON period from the outside. Instead of this, the control circuit 67 may also acquire the length of the ON period from the outside. As one example, the control circuit 67 may acquire the signal that indicates the length of the ON period from an apparatus that generates the control signal, and the like. In this case, the control circuit 67 can determine the length of the ON period without measuring by itself. Also, because the length of the current ON period can be acquired before the control signal falls, that is, before the ON period ends, the resistance value of the second resistor 64 at the ending of the current ON period can be controlled based on the length of the current ON period.

1-3-4 (2). Control of First Resistor

The control circuit 67 may change the resistance value of the first resistor 63 according to the length of the ON period of the main switching device 2. For example, the control circuit 67 may set the resistance value of the first resistor 63 to be smaller when the ON period is a third period than when the ON period is a fourth period that is shorter than the third period. As one example, the control circuit 67 supplies a voltage that causes the first resistor 63 to be small to the first resistor 63 as the ON period is longer within a predetermined range (as one example, a range that is equal to or less than the length of the switching period). Here, because change of current that flows through the power supply output terminal 105 is inhibited by self-induction of an induction load 106, the length of the ON period of the main switching device 2 may show a correlation with an instantaneous value of current that flows through the freewheeling diode 3 at an ending time point of an opposite ON period, consequently, at a time point when the main switching device 2 is to be turned on subsequently. The opposite ON period means a period during which the main switching device 1 (also referred to as an opposite switching device 1) that is connected in series with the main switching device 2 is turned on. Because the instantaneous value of the current that flows through the main switching device 2 is large as the ON period is long, the instantaneous value of the current that flows through the freewheeling diode 3 of the opposite switching device 1 is large by the self-induction of the induction load 106 when the main switching device 2 is turned off. Then, when the current that flows through the freewheeling diode 3 is large, the voltage overshoot that is generated at the time of the reverse recovery of the freewheeling diode 3 may be smaller compared to a case where the current is small. For that reason, by causing the resistance value of the first resistor 63 to be small as the ON period is long as described above, a turn-on speed of the main switching device 2 can be made fast and the switching loss can be reduced. Also, by causing the resistance value of the first resistor 63 to be large as the ON period is short, the turn-on speed of the main switching device 2 can be made slow and the voltage overshoot of the freewheeling diode 3 can be reduced.

The control circuit 67 may set the resistance value of the first resistor 63 in the current ON period of the main switching device 2 according to the length of the previous or former ON period of the main switching device 2. Also, when the ON period is specified by a pulse of the control signal, the control circuit 67 may set the resistance value of the first resistor 63 according to the width of the pulse. The control circuit 67 may determine the length of the ON period in a similar way to a case of controlling the second resistor 64.

According to the above-described switching power supply apparatus 100, because the resistance value of the second resistor 64 is changed by the control circuit 67 according to the length of the ON period of the main switching device 2, the resistance value of the second resistor 64 changes generally based on the instantaneous value of the current that flows through the main switching device 2 at the ending time point of the ON period. Therefore, the switching loss and/or the voltage overshoot when the main switching device 2 is turned off can be improved. Also, because the first resistor 63 is changed by the control circuit 67 according to the length of the ON period, the resistance value of the first resistor 63 changes generally based on the instantaneous value of the current that flows through the freewheeling diode 3 at the ending time point of the opposite ON period. Therefore, the switching loss and/or the voltage overshoot when the main switching device 2 is turned on can be improved. Accordingly, by a simple configuration with which the resistance value is changed according to the length of the ON period, the switching loss and the voltage overshoot can be reduced with good balance.

1-4. Control Signal

Figure 2:
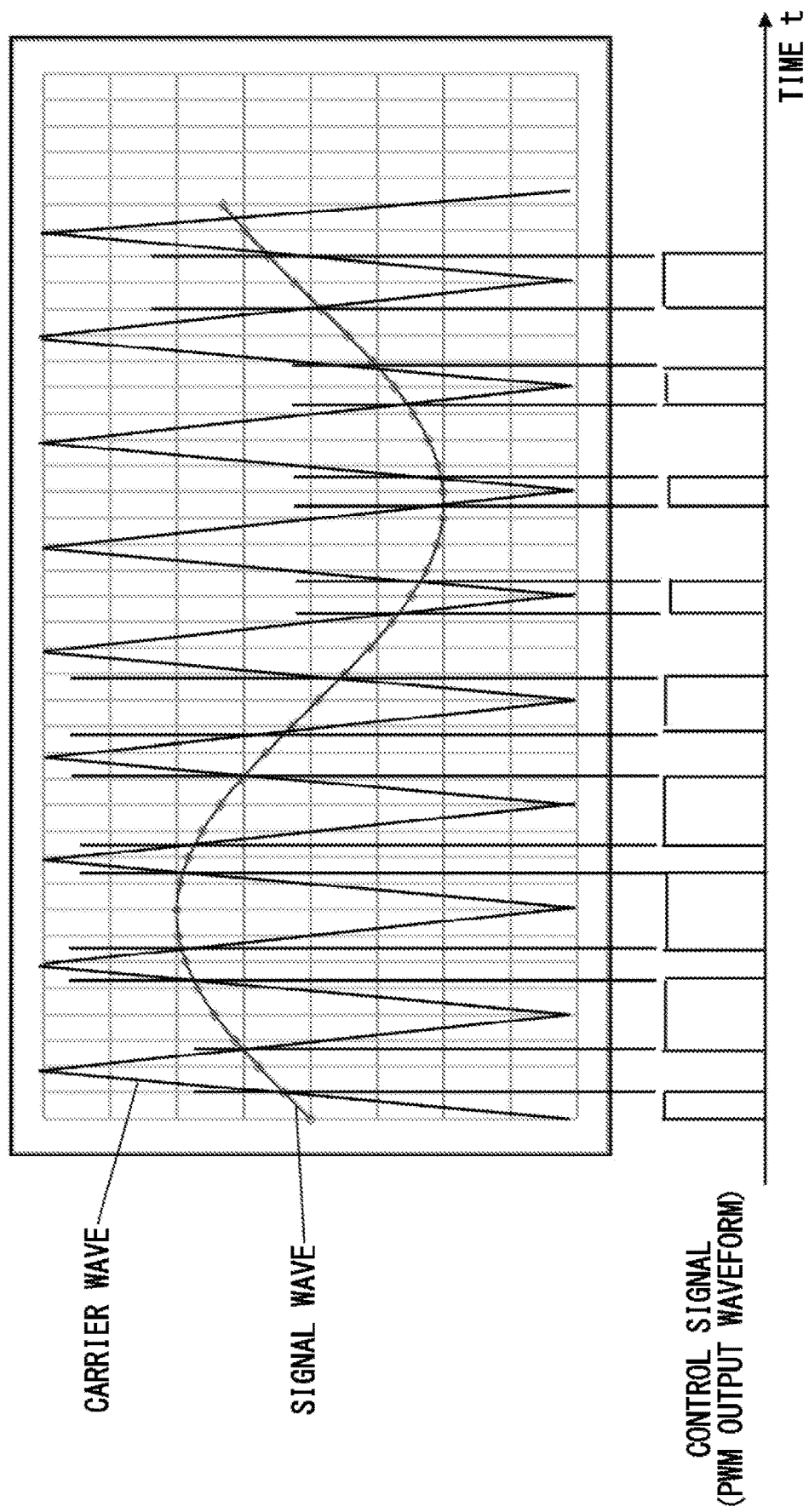
FIG. 2 shows a control signal.

FIG. 2 shows the control signal. In the drawings, an upper-side portion shows a carrier wave and a signal wave that are used for generating a control signal (a PWM output waveform) to the main switching devices 1, 2, and a lower-side portion shows a pulse of the generated control signal. The control circuit 67 may set the resistance value of the first resistor 63 and the resistance value of the second resistor 64 according to the width of the pulse of the control signal to the main switching device 2. When the resistance value is set according to the width of the pulse of the control signal in this way, compared to a case where the resistance value is set by acquiring a signal indicating the length of the pulse width, an increase of wiring to the control circuit 67 from the outside of the gate driving circuit 6 can be suppressed to simplify the configuration. Note that from the point of view of enhancing the correlation between the ON period of the main switching devices 1, 2 and the instantaneous value of the current flowing through the main switching devices 1, 2 at the ending time point of the ON period, it is preferable that a fundamental wave phase of the PWM signal and the current phase approximately matches with each other and the power factor is generally 1.

2. Second Embodiment

Figure 3:
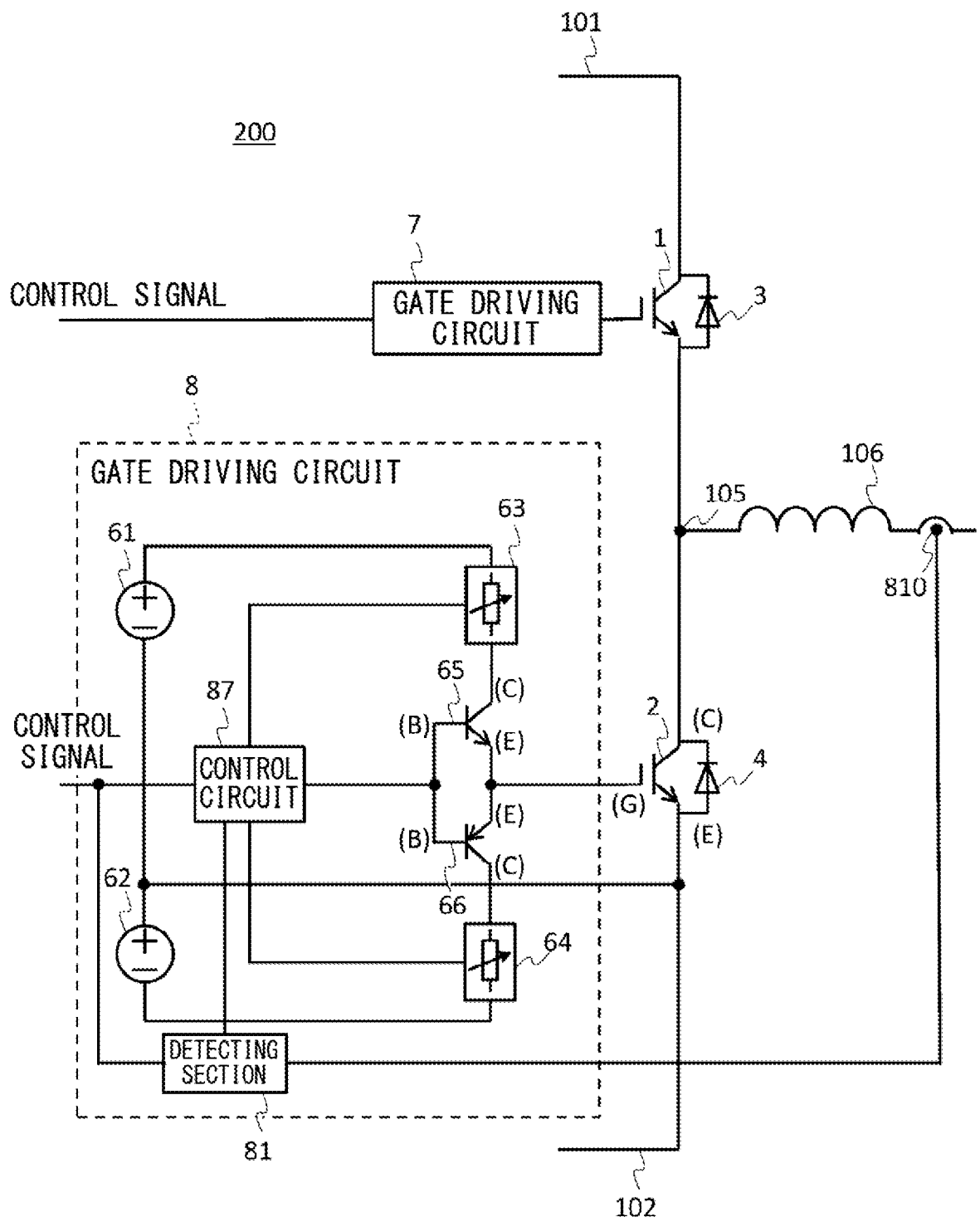
FIG. 3 shows a switching power supply apparatus 200 according to a second embodiment.

FIG. 3 shows a switching power supply apparatus 200 according to a second embodiment. The switching power supply apparatus 200 has a gate driving circuit 7 that is associated with a positive-side main switching device 1, and a gate driving circuit 8 that is associated with a negative-side main switching device 2.

2-1. Gate Driving Circuit

The gate driving circuits 7, 8 change a resistance value of a first resistor and/or a second resistor according to current that flows through the main switching devices 1, 2 during a period during which the main switching devices 1, 2 are turned on. Note that because the configuration of the positive-side gate driving circuit 7 is similar to the configuration of the negative-side gate driving circuit 8, the description of the configuration of the positive-side gate driving circuit 7 is omitted. The gate driving circuit 8 has a detecting section 81 and a control circuit 87.

2-1-1. Detecting Section

The detecting section 81 detects a magnitude of measurement target current including current that flows through the main switching device 2 during the period during which the main switching device 2 is turned on. In addition to the current that flows through the main switching device 2, the measurement target current may include current that flows through a freewheeling diode 3 and/or a freewheeling diode 4. Also, the detecting section 81 detects a magnitude of opposite measurement target current including current that flows from a negative-side main terminal (in the present embodiment, an emitter terminal) side toward the positive-side main terminal (in the present embodiment, a collector terminal) side of an opposite switching device 1 during a period during which the main switching device 2 is turned off. In addition to the current that flows through the freewheeling diode 3, the opposite measurement target current may include current that flows through the opposite switching device 1 and/or the freewheeling diode 4.

The detecting section 81 may supply a detection result to the control circuit 87. Note that in the present embodiment, as described below, opposite measurement target current for controlling the first resistor 63 is used.

Here, in the present embodiment, as one example, the detecting section 81 uses a current sensor 810 provided in series with the induction load 106 to measure current that flows through the power supply output terminal 105 as the measurement target current and the opposite measurement target current. The current sensor 810 may also be provided outside the switching power supply apparatus 200. Note that the current sensor 810 for measuring the measurement target current may also be provided on another position, and for example, may be provided in series with the main switching device 2 in a current path between the power supply output terminal 105 and the negative-side power line 102. Similarly, the current sensor 810 for measuring the opposite measurement target current may also be provided on another position, and for example, may also be provided in series with the main switching device 1 in a current path between the power supply output terminal 105 and the positive-side power line 101, and may also be provided in series with the freewheeling diode 3 between the emitter terminal and the collector terminal of the main switching device 1.

The detecting section 81 may sample the magnitude of the measurement target current at a predetermined timing during the period during which the main switching device 2 is turned on. For example, although the detecting section 81 may also be sample the measurement target current at any timing during the period during which the main switching device 2 is turned on, it is preferable that the sampling is performed at a timing when the measurement target current is stable. The sampling timing may be set based on the control signal to the main switching device 2, and for example, may be set after a lapse of a certain time period from the rising of the control signal to the main switching device 2. As one example, the sampling timing may be a timing when the main switching device 2 should be steadily in the turned-on state. The sampling timing may also be a falling timing of the control signal provided that the main switching device 2 does not start a turning-off operation.

The detecting section 81 may sample the magnitude the opposite measurement target current at a predetermined timing during the period during which the main switching device 2 is turned off (as one example, during the period during which the opposite switching device 1 is turned on). For example, although the detecting section 81 may also be sample the measurement target current at any timing during the period during which the main switching device 2 is turned off, it is preferable that the sampling is performed at a timing when the opposite measurement target current is stable. The sampling timing may be set based on the control signal to the main switching device 2, and for example, may be set after a lapse of a certain time period from the falling of the control signal to the main switching device 2. As one example, the sampling timing may be a timing when the main switching device 2 should be steadily in the turned-off state. The sampling timing may be set after a lapse of a certain time period that is longer than a dead time from the falling of the control signal of the main switching device 2.

2-1-2. Control Circuit

Similar to the control circuit 67, the control circuit 87 controls the first switching device 65 and the second switching device 66 according to the input control signal. Also, the control circuit 87 respectively changes the resistance values of the first resistor 63 and the second resistor 64. The control circuit 87 may changes the resistance values so as to improve the switching loss and/or the voltage overshoot during a period during which the main switching device 2 carries out switching. As one example, the control circuit 87 may increase the switching loss while reducing the voltage overshoot to the extent that breakdown of the devices can be prevented.

2-1-2 (1). Control of Second Resistor

The control circuit 87 may change the resistance value of the second resistor 64 according to the magnitude of the measured measurement target current (as one example, the current that flows through the power supply output terminal 105) including current that flows through the main switching device 2 during the period during which the main switching device 2 is turned on. For example, the control circuit 87 may set the resistance value of the second resistor 64 to be larger when the detected magnitude of the measurement target current is a first magnitude than when the detected magnitude of the measurement target current is a second magnitude that is smaller than the first magnitude. As one example, the control circuit 87 supplies a voltage that causes the resistance value of the second resistor 64 to be large to the second resistor 64 as the measurement target current is large within a predetermined range (as one example, a range that is equal to or less than the maximum rated current). Also, the control circuit 87 may convert the measurement target current detected by the detecting section 81 to a voltage for controlling the second resistor 64 and supply the voltage to the second resistor 64. Accordingly, the voltage overshoot when the main switching device 2 is turned off is reduced. The control circuit 87 may set the resistance value of the second resistor 64 during the current ON period according to the magnitude of the measurement target current measured during the previous or former ON period. That setting the resistance value of the second resistor 64 according to the magnitude of the measurement target current measured during the former ON period may be that setting the resistance value based on an average value of the magnitude of the measurement target current during the former ON period or a weighted average value, for example.

2-1-2 (2). Control of First Resistor

The control circuit 87 may change the resistance value of the first resistor 63 according to the magnitude of the opposite measurement target current (as one example, current that flows through the power supply output terminal 105) including current that flows from the emitter terminal side toward the collector terminal side of the opposite switching device 1. For example, the control circuit 87 may set the resistance value of the first resistor 63 to be smaller when the detected magnitude of the opposite measurement target current is a third magnitude than when the detected magnitude of the opposite measurement target current is a fourth magnitude that is smaller than the third magnitude. As one example, the control circuit 87 supplies a voltage that causes the first resistor 63 to be small to the first resistor 63 as the magnitude of the opposite measurement target current is large within a predetermined range (as one example, a range that is equal to or less than the maximum rated current). Also, the control circuit 87 may convert the opposite measurement target current detected by the detecting section 81 to a voltage for controlling the first resistor 63 and supply the voltage to the first resistor 63. Accordingly, the turn-on speed of the main switching device 2 can be made fast and the turn-on loss can be reduced. Also, by causing the resistance value of the first resistor 63 to be large as the magnitude of the opposite measurement target current is small, the turn-on speed of the main switching device 2 can be made slow and the voltage overshoot of the freewheeling diode 3 can be reduced. The control circuit 67 may set the resistance value of the first resistor 63 during the current ON period of the main switching device 2 according to the previous or former magnitude of the opposite measurement target current of the opposite switching device 1.

2-1-2 (3). Control of First Resistor

The control circuit 87 may also change the resistance value of the first resistor 63 according to the magnitude of the measurement target current including current that flows through the main switching device 2. For example, the control circuit 87 may set the resistance value of the first resistor 63 to be smaller when the detected magnitude of the measurement target current is a third magnitude than when the detected magnitude of the measurement target current is a fourth magnitude that is smaller than the third magnitude. As one example, the control circuit 87 supplies a voltage that causes the resistance value of the first resistor 63 to be small to the first resistor 63 as the magnitude of the measurement current is large within a predetermined range (as one example, a range that is equal to or less than the maximum rated current). Also, the control circuit 87 may convert the measurement target current detected by the detecting section 81 to a voltage for controlling the first resistor 63 and supply the voltage to the first resistor 63. Accordingly, the turn-on speed of the main switching device 2 can be made fast and the turn-on loss can be reduced. Also, by causing the resistance value of the first resistor 63 to be large as the magnitude of the measurement target current is small, the turn-on speed of the main switching device 2 can be made slow and the voltage overshoot of the freewheeling diode 3 can be reduced. The control circuit 67 may set the resistance value of the first resistor 63 during the current ON period of the main switching device 2 according to the previous or former magnitude of the measurement target current of the opposite switching device 1.

According to the above-described switching power supply apparatus 200, because the resistance value of the second resistor 64 is changed by the control circuit 87 according to the magnitude of the measurement target current including current that flows through the main switching device 2, the switching loss and/or the voltage overshoot when the main switching device 2 is turned off can be improved. Also, because the resistance value of the first resistor 63 is changed by the control circuit 87 according to the magnitude of the opposite measurement target current including current that flows through the opposite switching device 1, the switching loss and/or the voltage overshoot when the main switching device 2 is turned on can be improved. Accordingly, by a simple configuration with which the resistance value is changed according to the magnitude of the measurement target current and the opposite measurement target current, the switching loss and the voltage overshoot can be reduced with good balance.

3. Characteristics of Switching Power Supply Apparatus

Next, the characteristics of each section of the switching power supply apparatuses 100, 200 are described. Note that because the characteristics of the gate driving circuits 5, 7 are similar to the characteristics of the gate driving circuits 6, 8, the descriptions of the characteristics of the gate driving circuits 5, 7 are omitted. Also, because the characteristic of the main switching device 1 is similar to the characteristic of the main switching device 2, the description of the characteristic of the main switching device 1 is omitted.

Figure 4:
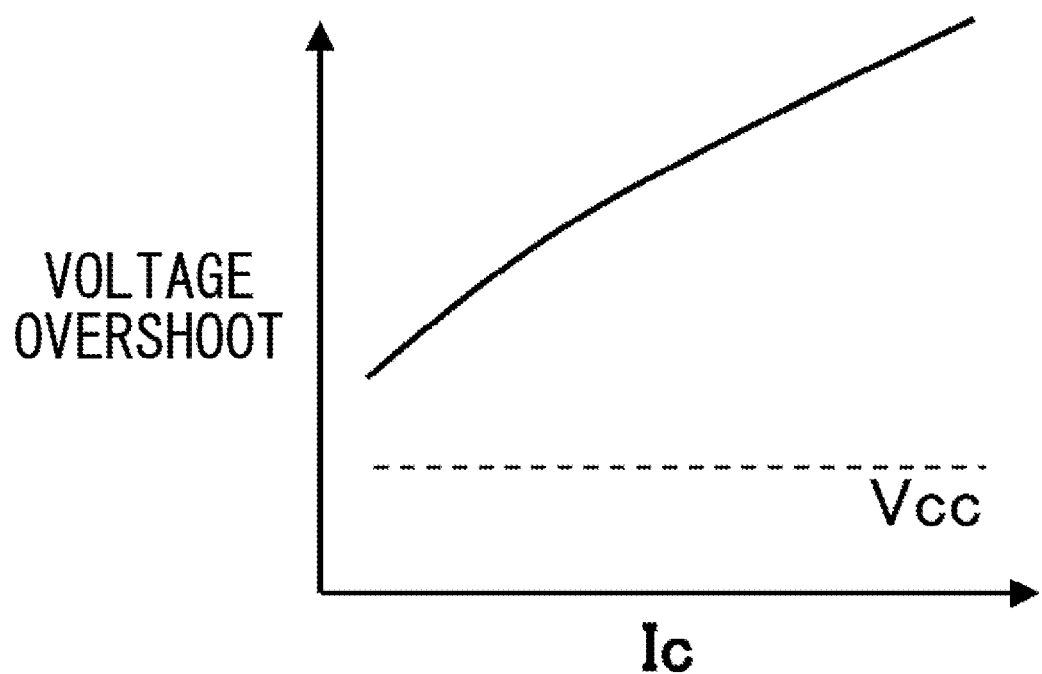
FIG. 4 shows a relation between voltage overshoot that is generated when a main switching device 2 is turned off, and an output current value Ic.

FIG. 4 shows a relation between the voltage overshoot that is generated during the period during which the main switching device 2 is turned off and an output current value Ic in case where the resistance value of the second resistor 64 is constant. The vertical axis in the drawing indicates the voltage overshoot generated at the main switching device 2 during the period during which the main switching device 2 is turned off, and the horizontal axis indicates the output current value Ic including current that flows through the main switching device 2 during the period during which the main switching device 2 is turned on. Note that the output current value Ic may be the instantaneous value of current, and also, may be a value of current that is output from the power supply output terminal 105. Also, Vcc in the drawing indicates a potential difference set between the Positive-side power line 101 and the negative-side power line 102. As shown in this drawing, as the output current value Ic during the period during which the main switching device 2 is turned on is larger, the voltage overshoot generated during the period during which the main switching device 2 is turned off is larger.

Figure 5:
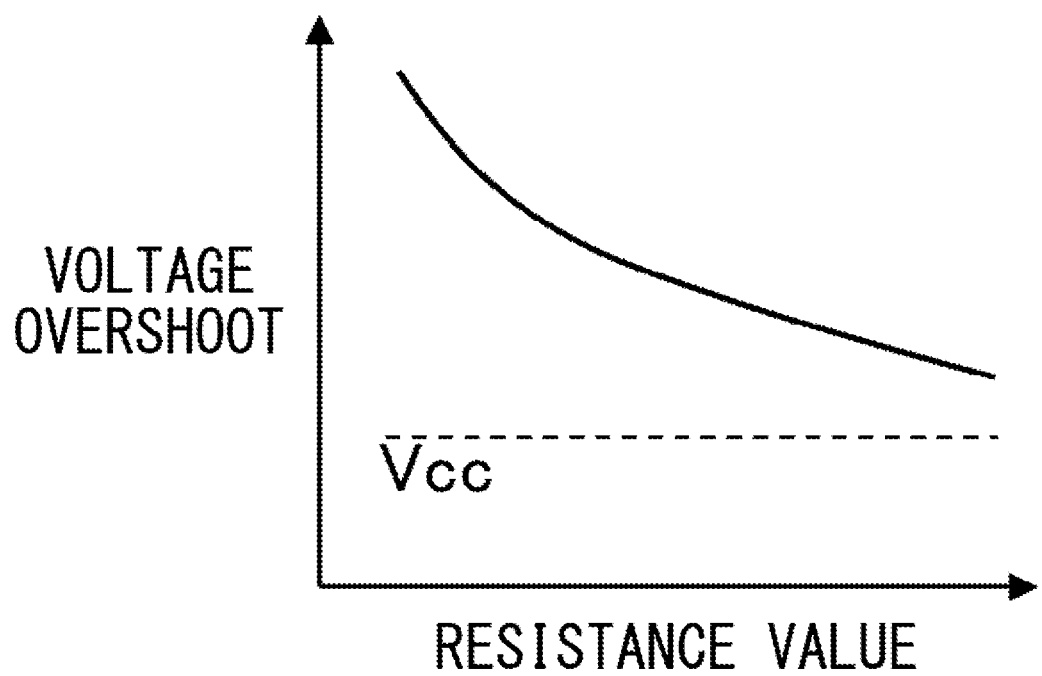
FIG. 5 shows a relation between voltage overshoot that is generated when the main switching device 2 is turned off, and a resistance value of a second resistor 64.

FIG. 5 shows a relation between the voltage overshoot generated during the period during which the main switching device 2 is turned off and the resistance value of the second resistor 64 when the magnitude of the output current value Ic is constant. The vertical axis in the drawing indicates the voltage overshoot generated at the main switching device 2 during the period during which the main switching device 2 is turned off, and the horizontal axis indicates the resistance value of the second resistor 64. As shown in this drawing, as the resistance value of the second resistor 64 is larger, the voltage overshoot during the period during which the main switching device 2 is turned off is smaller. Accordingly, according to FIG. 4 and FIG. 5, it can be known that when the output current value Ic during the period during which the main switching device 2 is turned on is large, causing the resistance value of the second resistor 64 to be large is effective for suppressing the voltage overshoot during the period during which the main switching device 2 is turned off.

Figure 6:
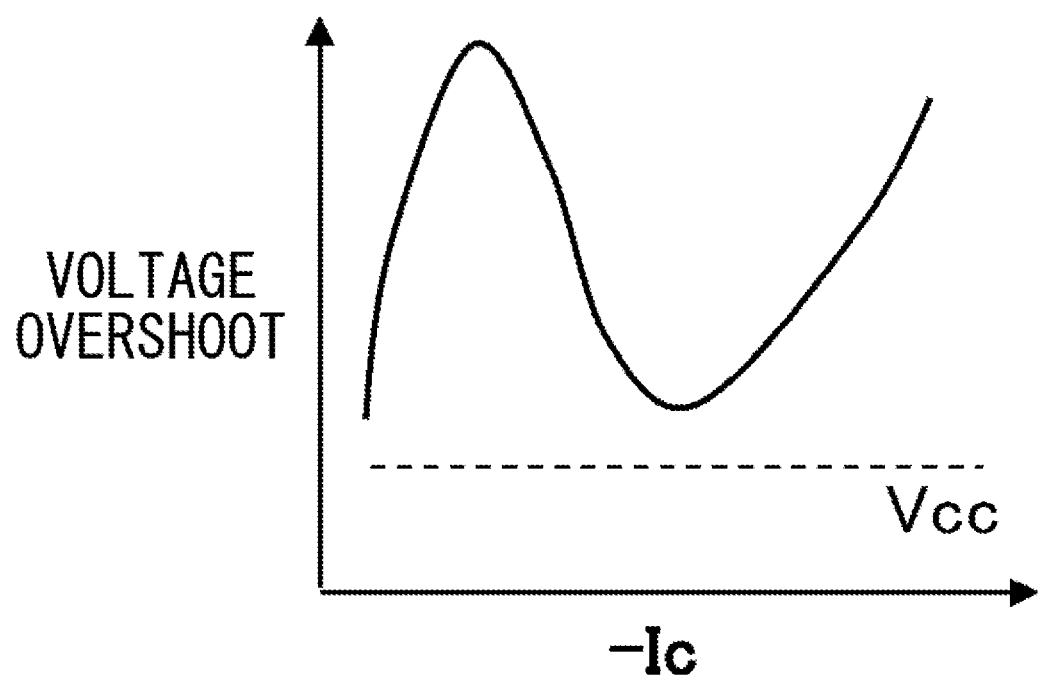
FIG. 6 shows a reverse recovery characteristic of a freewheeling diode 4.

FIG. 6 shows the reverse recovery characteristic of the freewheeling diode 3 when the resistance value of the first resistor 63 is constant. The vertical axis in the drawing indicates the voltage overshoot generated at the freewheeling diode 3 during the period during which the main switching device 2 is turned on, and the horizontal axis indicates current of the freewheeling diode 3 during the period during which the main switching device 2 is turned on. In this example, when the current of the freewheeling diode 3 during the period during which the main switching device 2 is turned on is small, the voltage overshoot generated at the freewheeling diode 3 is large. Particularly, when the current of the freewheeling diode 3 during the period during which the main switching device 2 is turned on is small, if the resistance value of the first resistor 63 is small, the voltage overshoot during the period during which the main switching device 2 is turned on (at the time of reverse recovery of the freewheeling diode 3) is large.

Figure 7:
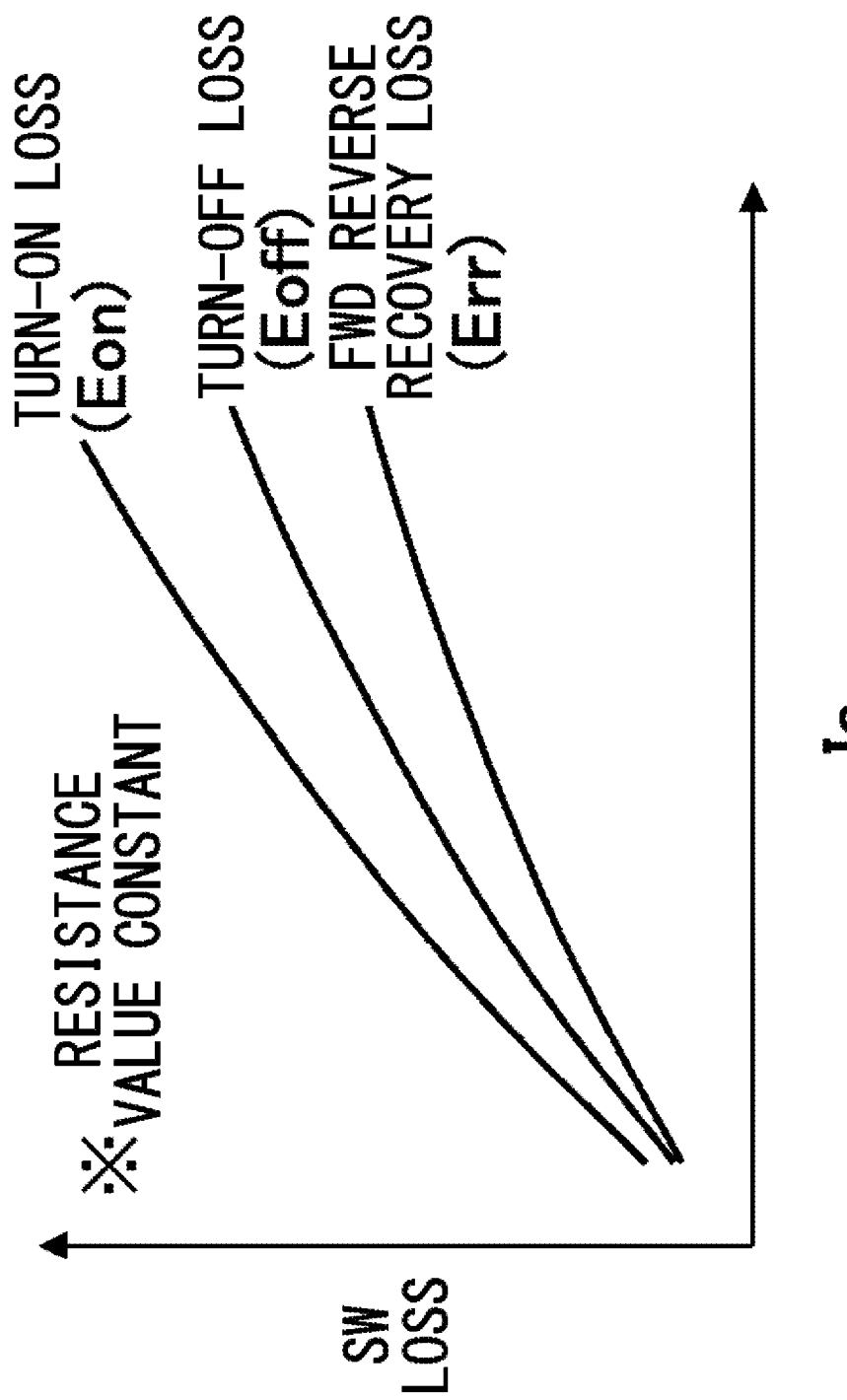
FIG. 7 shows a relation between an output current value Ic during an ON period of the main switching device 2 when resistance values of a first resistor 63 and a second resistor 64 are constant, and switching loss that occurs when the main switching device 2 carries out switching.

FIG. 7 shows a relation between the output current value Ic of the ON period of the main switching device 2 and the switching loss occurs during the period during which the main switching device 2 carries out switching (is turned on, turned off) when the resistance values of the first resistor 63 and the second resistor 64 are constant. The horizontal axis in the drawing indicates the output current value Ic during the period during which the main switching device 2 is turned on, and the vertical axis indicates the switching loss. Also, the term "Eon" in the drawing indicates the loss that occurs during the period during which the main switching device 2 is turned on, the term "Eoff" indicates the loss that occurs during the period during which the main switching device 2 is turned off, and the term "Err" indicates the reverse recovery loss. As shown in this drawing, as the output current value Ic during the period during which the main switching device 2 is turned on is larger, the switching loss is larger.

Figure 8:
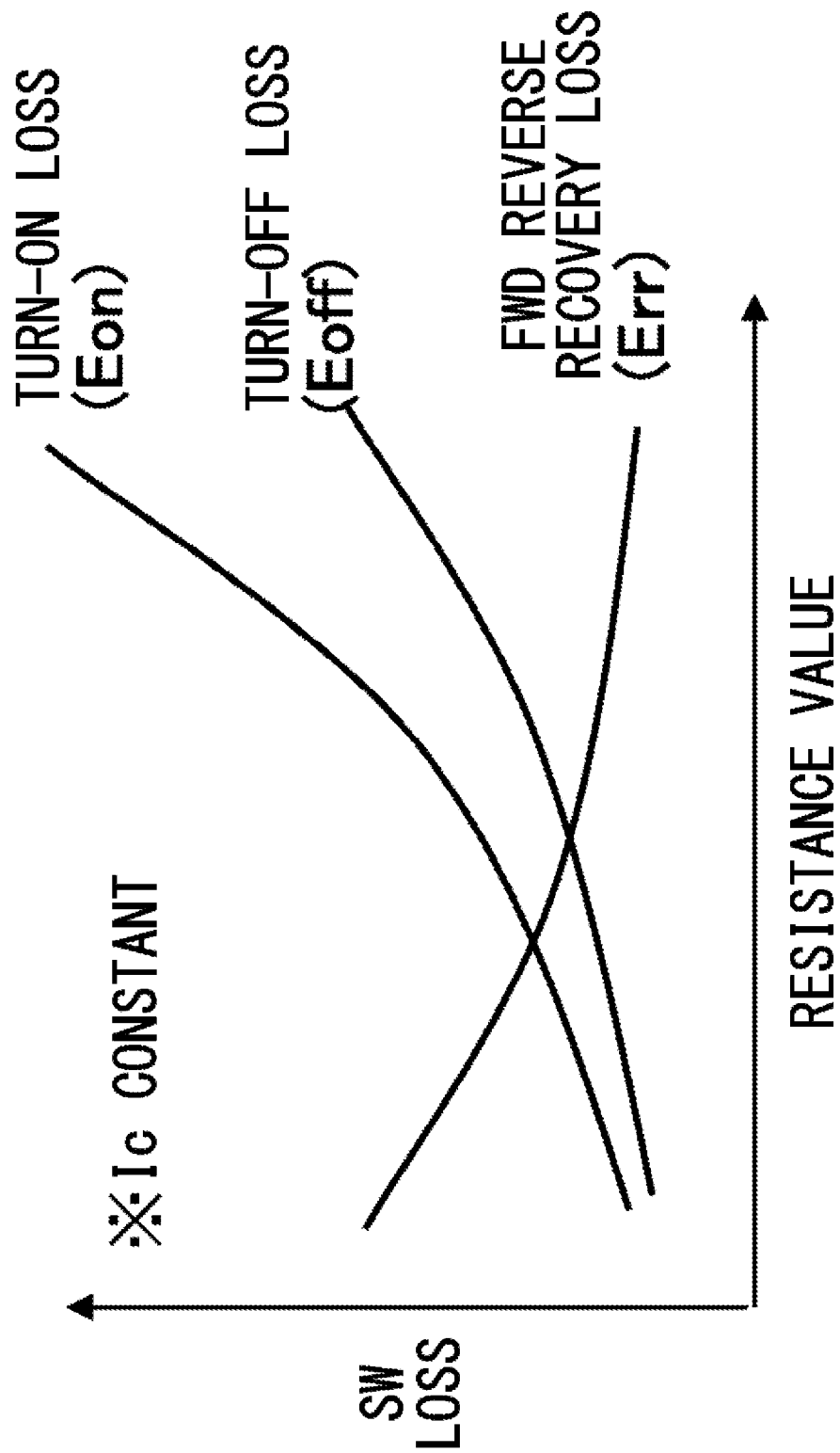
FIG. 8 shows a relation between the resistance values of the first resistor 63 and the second resistor 64 when the output current value Ic during the ON period of the main switching device 2 is constant, and the switching loss that occurs when the main switching device 2 carries out switching.

FIG. 8 shows a relation between the resistance values of the first resistor 63 and the second resistor 64, and the switching loss that occurs during the period during which the main switching device 2 carries out switching (is turned on, turned off) when the output current value Ic of the ON period of the main switching device 2 is constant. The horizontal axis in the drawing indicates the resistance values of the first resistor 63 and the second resistor 64, and the vertical axis indicates the switching loss. As shown in this drawing, as the resistance values of the first resistor 63 and the second resistor 64 are larger, the loss Eon, Eoff that occur at the main switching device 2 when the main switching device 2 carries out switching are larger. On the other hand, as the resistance value of the first resistor 63 is larger, the reverse recovery loss Err of the freewheeling diode 3 is smaller.

Figure 9:
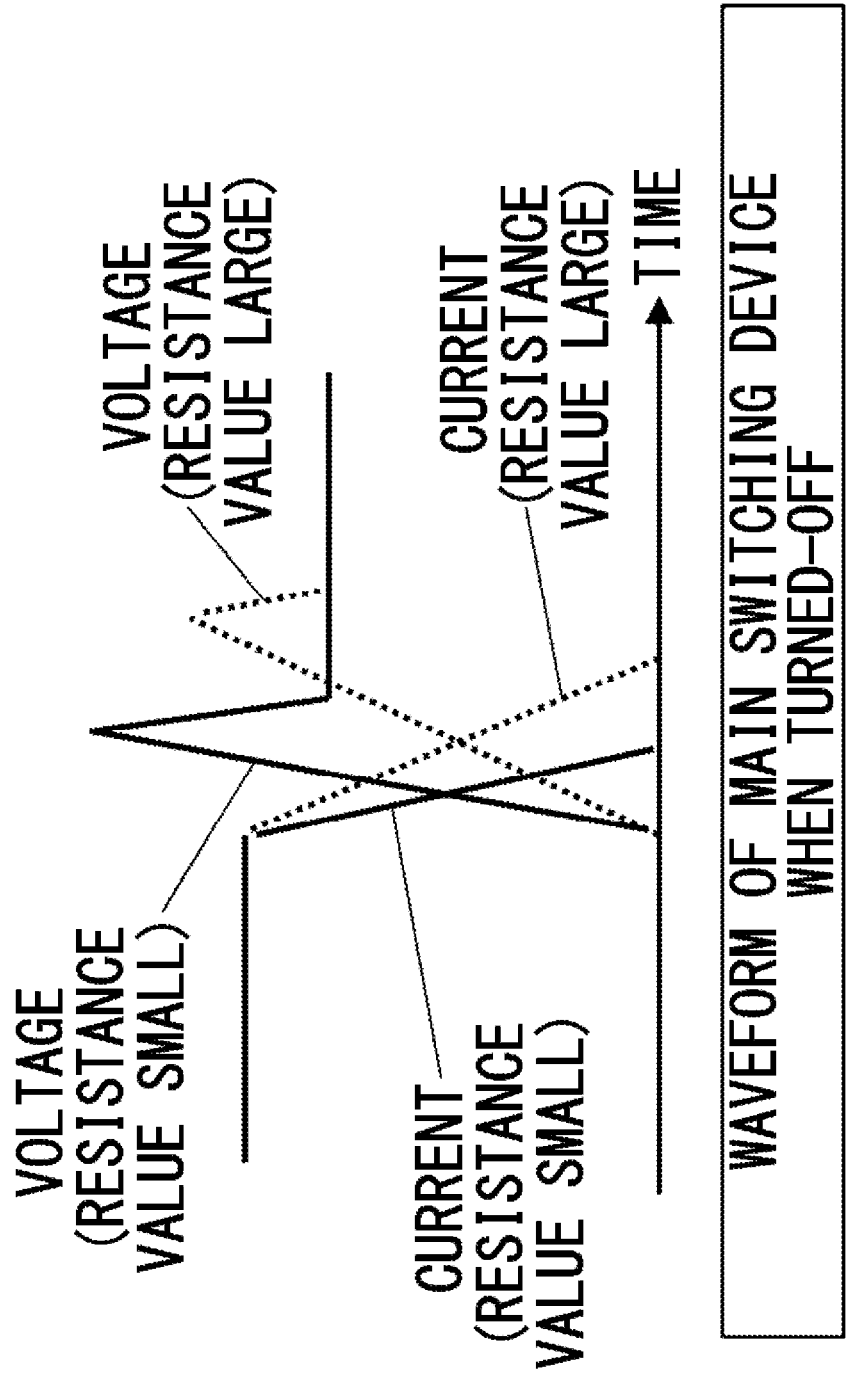
FIG. 9 shows the voltage and the current during a period during which the main switching device 2 is turned off.

FIG. 9 shows the voltage and the current during the period during which the main switching device 2 is turned off. In the drawing, the horizontal axis indicates time, and the vertical axis indicates a device voltage or a device current of the main switching device 2. Also, in the drawing, the phrase "voltage (resistance value small)" indicates the voltage overshoot during the period during which the main switching device 2 is turned off when the resistance value of the second resistor 64 is small, and the phrase "voltage (resistance value large)" indicates the voltage overshoot during the period during which the main switching device 2 is turned off when the resistance value of the second resistor 64 is large. As shown in this drawing, the voltage overshoot during the period during which the main switching device 2 is turned off when the resistance value of the second resistor 64 is small is larger than the voltage overshoot during the period during which the main switching device 2 is turned off when the resistance value is large. In the drawing, the phrase "current (resistance value small)" indicates device current of the main switching device 2 when the resistance value of the second resistor 64 is small, and the phrase "current (resistance value large)" indicates device current when the resistance value is large. As shown in this drawing, the switching speed when the resistance value of the second resistor 64 is small is faster than the switching speed when the resistance value is large.

Figure 10:
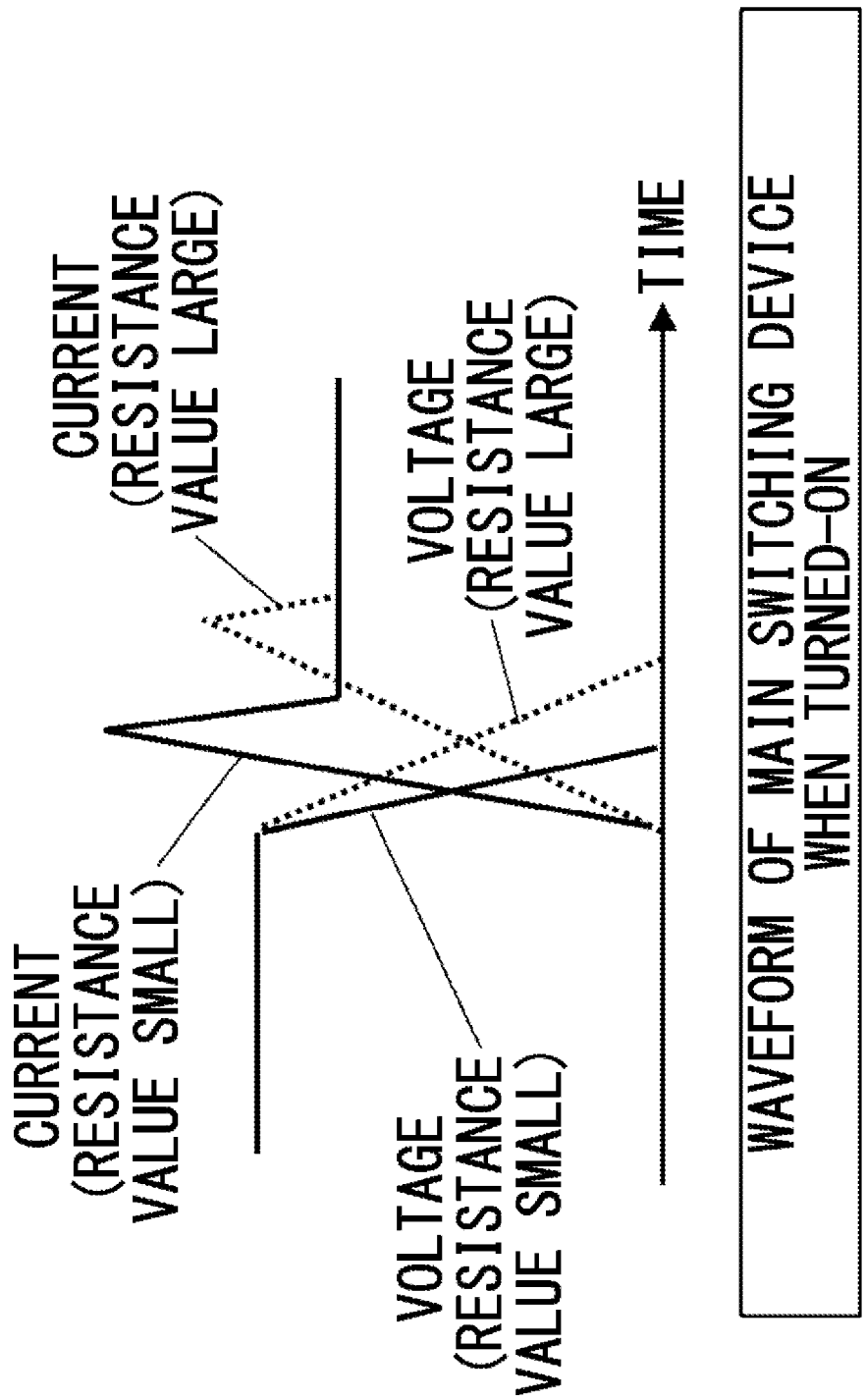

FIG. 10 shows a voltage and current during the period where the main switching device 2 is turned on. In the drawing, the horizontal axis indicates time, and the vertical axis indicates the device voltage or device current of the main switching device 2. Also, in the drawing, the phrase "voltage (resistance value small)" indicates the voltage during the period during which the main switching device 2 is turned on when the resistance value of the first resistor 63 is small, and the phrase "voltage (resistance value large)" indicates the voltage during the period during which the main switching device 2 is turned on when the resistance value is large. Also, in the drawing, the phrase "current (resistance value small)" indicates the device current of the main switching device 2 when the resistance value of the first resistor 63 is small, and the phrase "current (resistance value large)" indicates the device current when the resistance value is large. As shown in this drawing, the switching speed when the resistance value of the first resistor 63 is small is faster than the switching speed when the resistance value is large.

Figure 11:
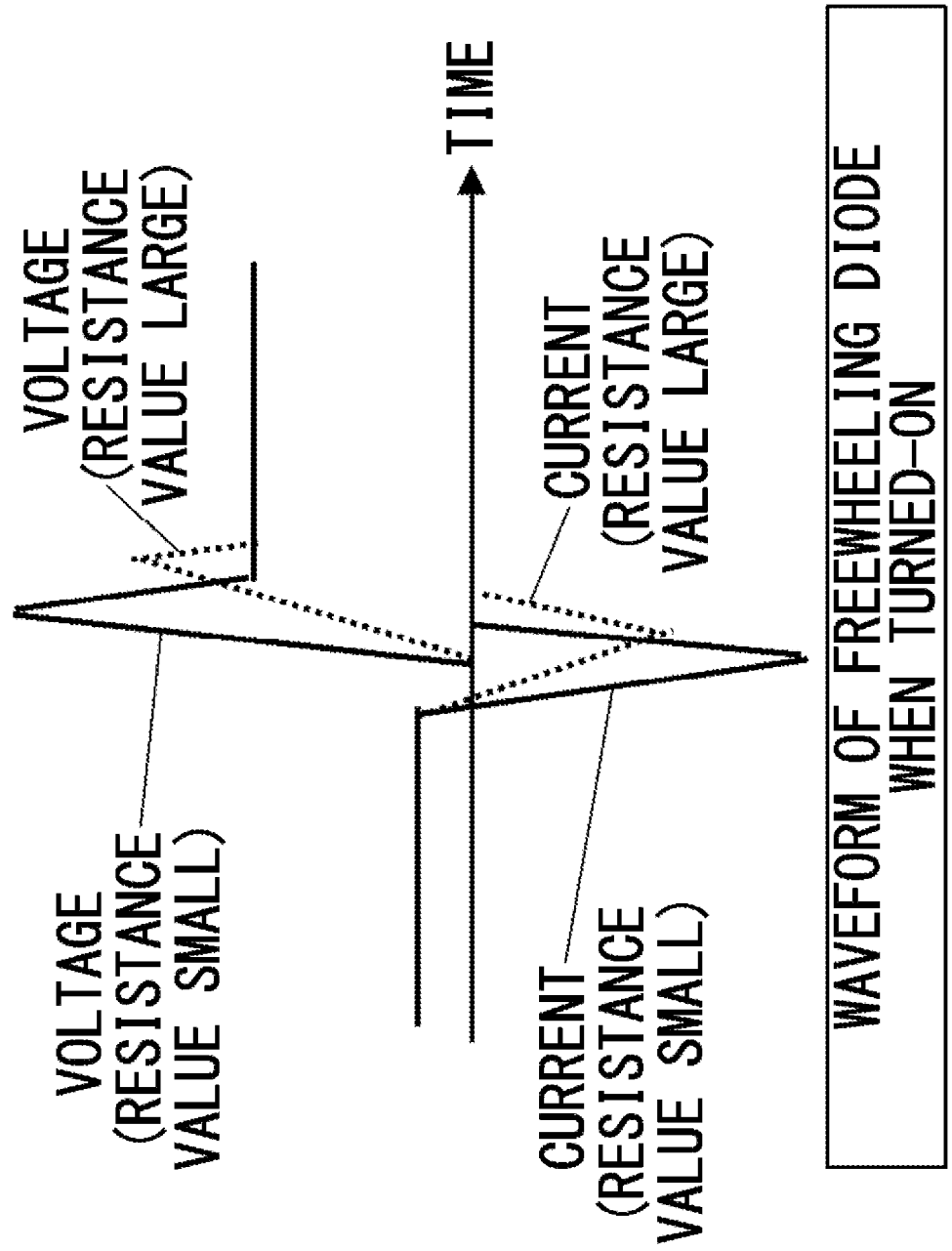

FIG. 11 shows the voltage and current at the time of reverse recovery of the freewheeling diode 3 during the period during which the main switching device 2 is turned on. In the drawing, the horizontal axis indicates time, and the vertical axis indicates the device voltage or the device current of the freewheeling diode 3. Also, in the drawing, the phrase "voltage (resistance value small)" indicates the voltage overshoot of the freewheeling diode 3 during the period during which the main switching device 2 is turned on when the resistance value of the first resistor 63 is small, and the phrase "voltage (resistance value large)" indicates the voltage overshoot when the resistance value is large. As shown in this drawing, the voltage overshoot during the period during which the main switching device 2 is turned on when the resistance value of the first resistor 63 is small is larger than the voltage overshoot when the resistance value is large. In the drawing, the phrase "current (resistance value small)" indicates the reverse recovery current of the freewheeling diode 3 during the period during which the main switching device 2 is turned on when the resistance value of the first resistor 63 is small, and the phrase "current (resistance value large)" indicates the reverse recovery current when the resistance value of the first resistor 63 is large. As shown in this drawing, the reverse recovery current when the resistance value of the first resistor 63 is small is larger than the reverse recovery current when the resistance value is large.

Figure 12:
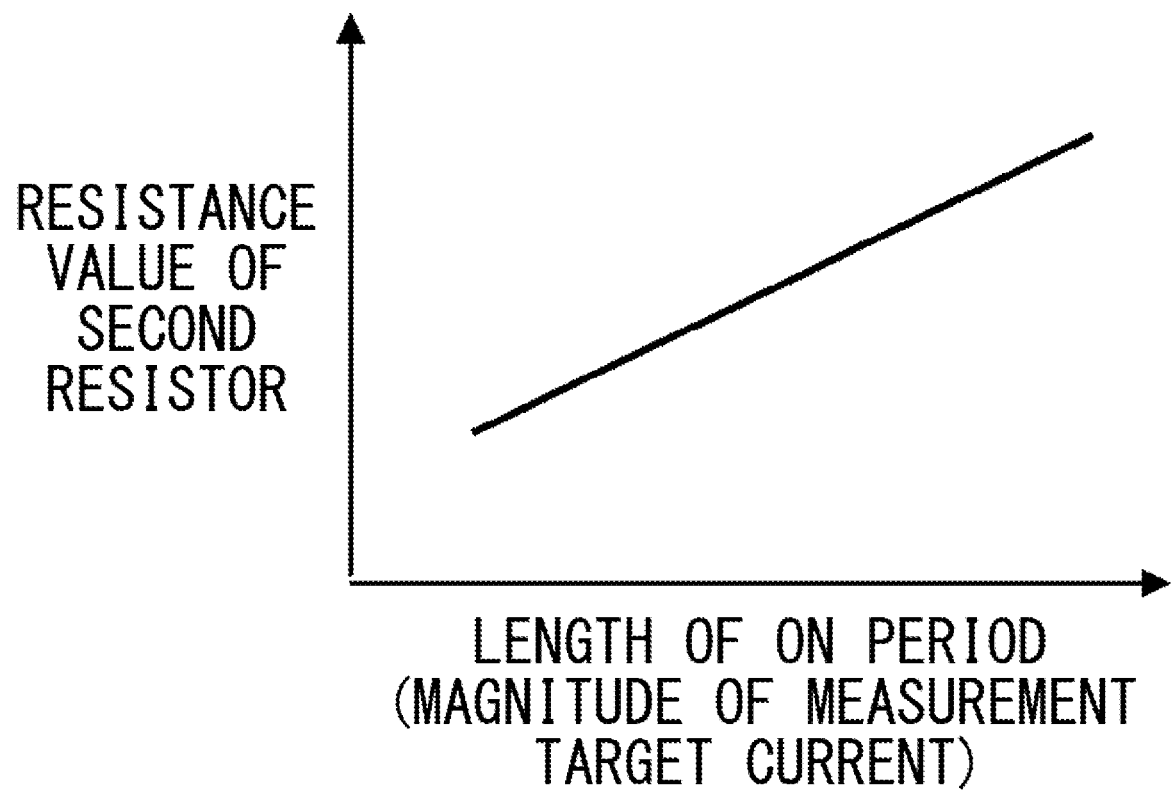
FIG. 12 shows a relation between the length of the ON period (or the magnitude of the measurement target current) and the resistance value of the second resistor 64.

FIG. 12 shows a relation between the length of the ON period (or the magnitude of the measurement target current) and the resistance value of the second resistor 64. In the drawing, the horizontal axis indicates the length of the ON period of the main switching device 2 or the magnitude of the measurement target current during the ON period, and the vertical axis indicates the resistance value set in the second resistor 64. As shown in this drawing, as the ON period is longer or the magnitude of the measurement target current is larger, the resistance value of the second resistor 64 is set to be larger. Note that in this example, the resistance value of the second resistor 64 is set such that the voltage overshoot during the period during which the main switching device 2 is turned off does not change even if the length of the ON period (or the magnitude of the measurement target current) changes.

Figure 13:
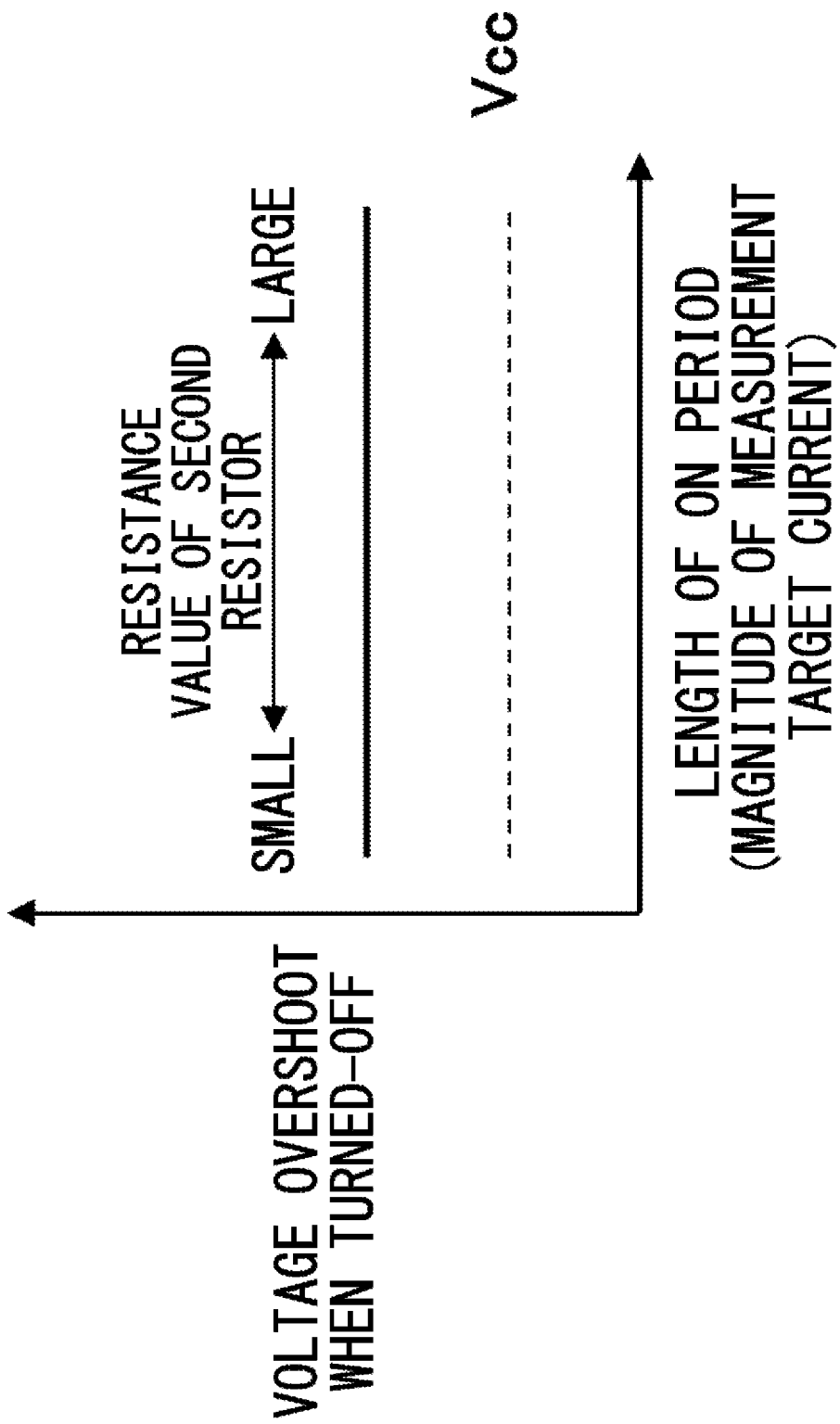
FIG. 13 shows voltage overshoot that is generated during the period during which the main switching device 2 is turned off when the resistance value is set as FIG. 12.

FIG. 13 shows the voltage overshoot generated during the period during which the main switching device 2 is turned off when the resistance value is set as shown in FIG. 12. In the drawing, the horizontal axis indicates the length of the ON period of the main switching device 2 or the magnitude of the measurement target current during the ON period, and the vertical axis indicates the voltage overshoot generated during the period during which the main switching device 2 is turned off. As shown in this drawing, by setting the resistance value as shown in FIG. 12, the voltage overshoot during the period during which the main switching device 2 is turned off is maintained constant regardless of the length of the ON period.

Figure 14:
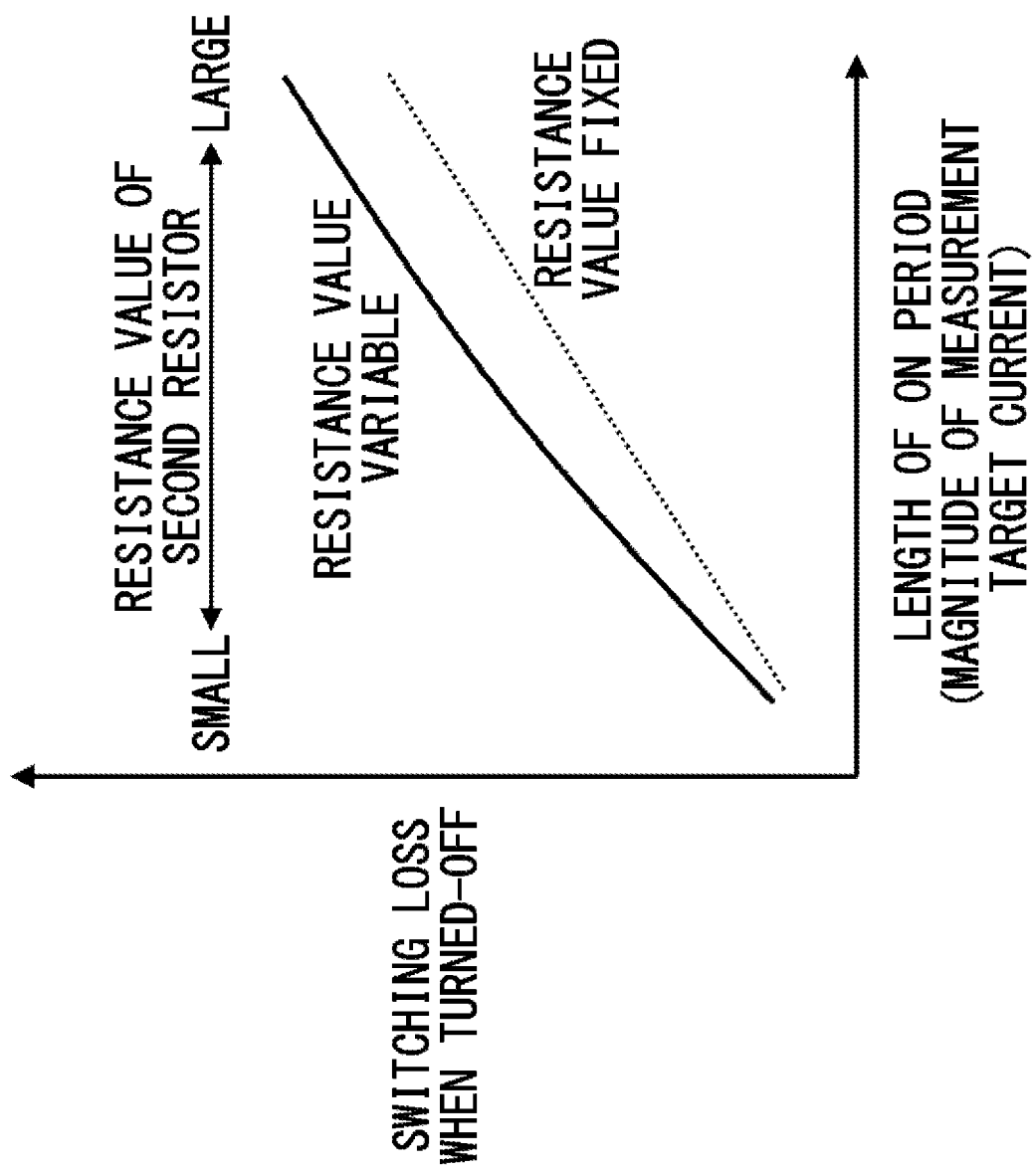
FIG. 14 shows the switching loss that occurs during the period during which the main switching device 2 is turned off in when the resistance value is set as FIG. 12.

FIG. 14 shows the switching loss that occurs during the period during which the main switching device 2 is turned off when the resistance value is set as shown in FIG. 12. In the drawing, the horizontal axis indicates the length of the ON period of the main switching device 2 or the magnitude of the measurement target current during the ON period, and the vertical axis indicates the switching loss during the period during which the main switching device 2 is turned off. Also, in the drawing, the phrase "resistance value fixed" indicates the switching loss when the resistance value of the second resistor 64 is maintained in a constant value, and the phrase "resistance value variable" indicates that the switching loss when the resistance value of the second resistor 64 is set as shown in FIG. 12. As shown in this drawing, when the resistance value is set as shown in FIG. 12, the switching loss only slightly increases if compared to a case where the resistance value is maintained in a constant value.

Figure 15:
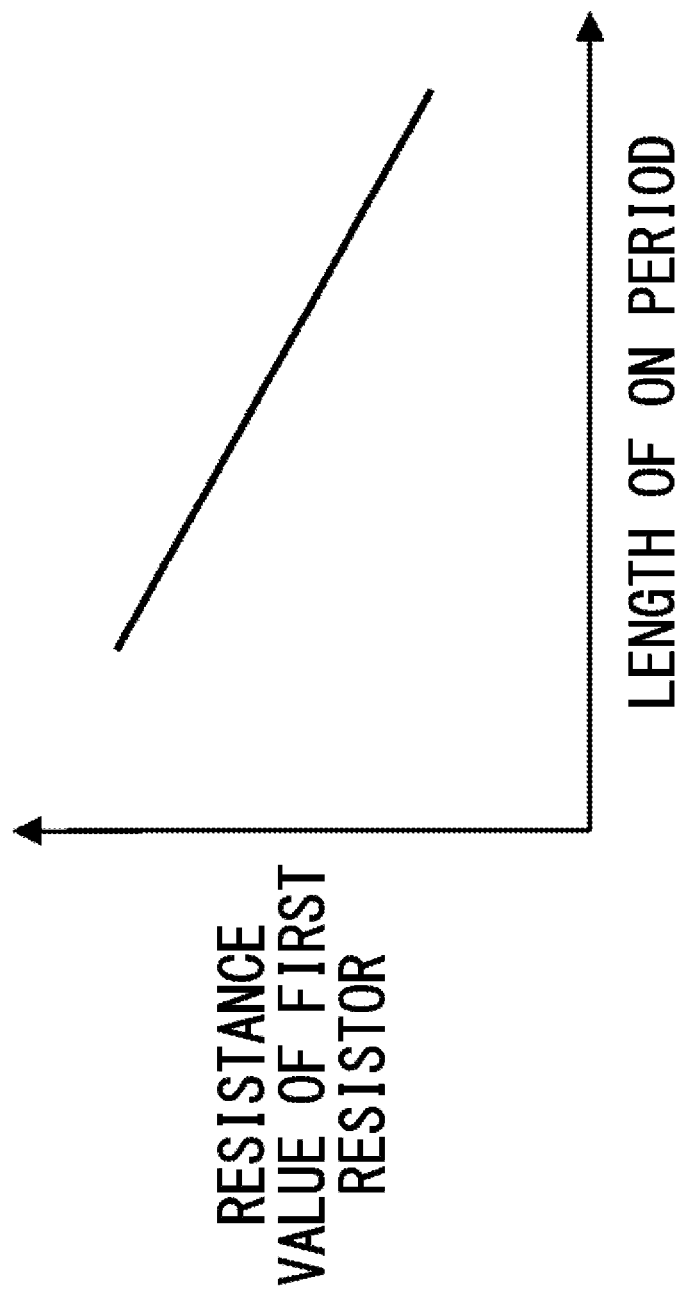
FIG. 15 shows a relation between the length of the ON period and the resistance value of the first resistor 63.

FIG. 15 shows a relation between the length of the ON period of the main switching device 2 and the resistance value of the first resistor 63. The current that has flown through the main switching device 2 at the ending of the ON period flows back to the freewheeling diode 3, and flows through the freewheeling diode 3 during the opposite ON period. Therefore, if the ON period of the main switching device 2 is long, the current flowing through the main switching device 2, and consequently, current flowing back to the freewheeling diode 3 is also large. In the drawing, the horizontal axis indicates the length of the ON period of the main switching device 2 (or the magnitude of the opposite measurement target current during the opposite ON period, or the magnitude of the measurement target current during the ON period), and the vertical axis indicates the resistance value set in the first resistor 63. As shown in this drawing, as the ON period is longer, the resistance value of the first resistor 63 is set to be smaller. Note that in this example, the resistance value of the first resistor 63 is set such that the voltage overshoot during the period during which the main switching device 2 is turned on and at the timing of the reverse recovery of the freewheeling diode 3 does not change even if the length of the ON period changes.

Figure 16:
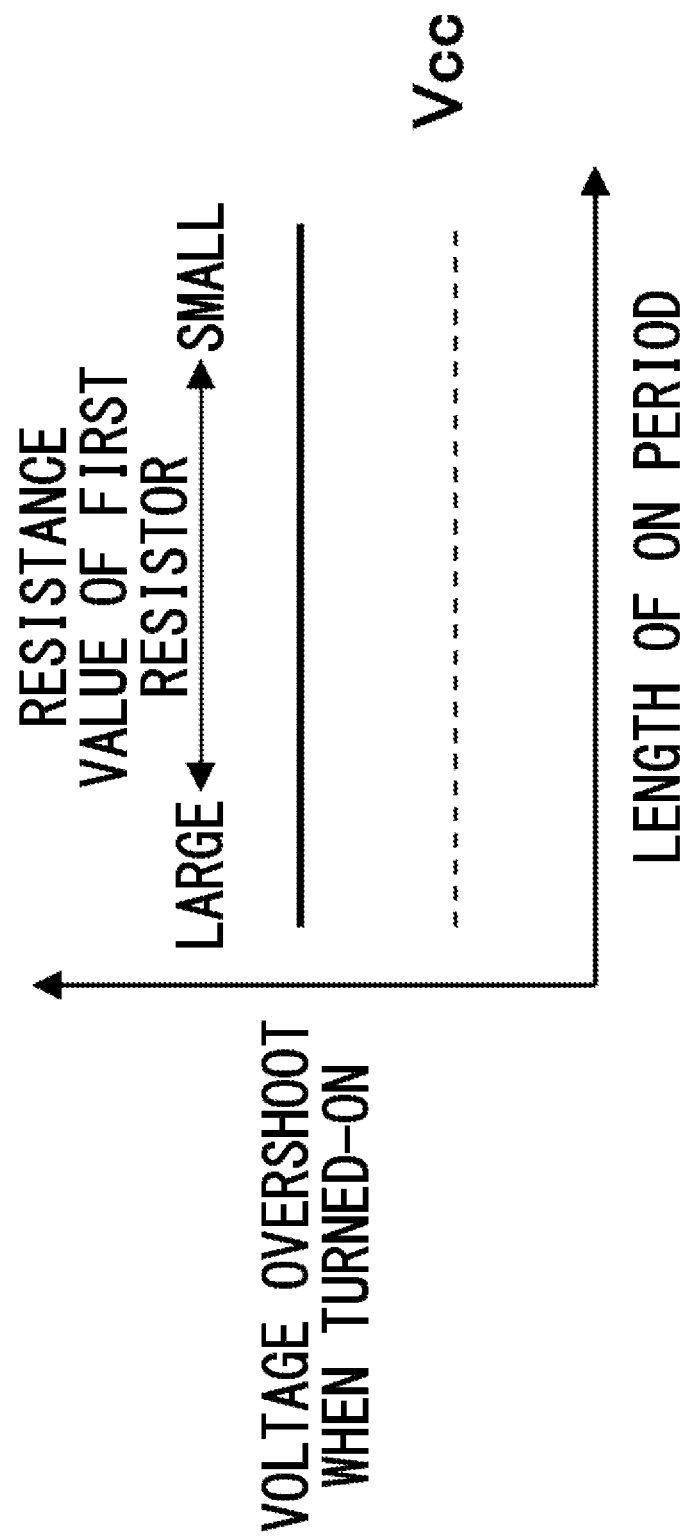
FIG. 16 shows voltage overshoot that is generated at a freewheeling diode 3 during the period during which the main switching device 2 is turned on when the resistance value is set as FIG. 15.

FIG. 16 shows the voltage overshoot generated at the freewheeling diode 3 during the period during which the main switching device 2 is turned on when the resistance value is set as shown in FIG. 15. In the drawing, the horizontal axis indicates the length of the ON period of the main switching device 2 (or the magnitude of the opposite measurement target current during the opposite ON period, or the magnitude of the measurement target current during the ON period), and the vertical axis indicates the voltage overshoot generated at the freewheeling diode 3 during the period during which the main switching device 2 is turned on. As shown in this drawing, by setting the resistance value as shown in FIG. 15, the voltage overshoot of the freewheeling diode 3 during the period during which the main switching device 2 is turned on is maintained constant regardless of the length of the ON period.

Figure 17:
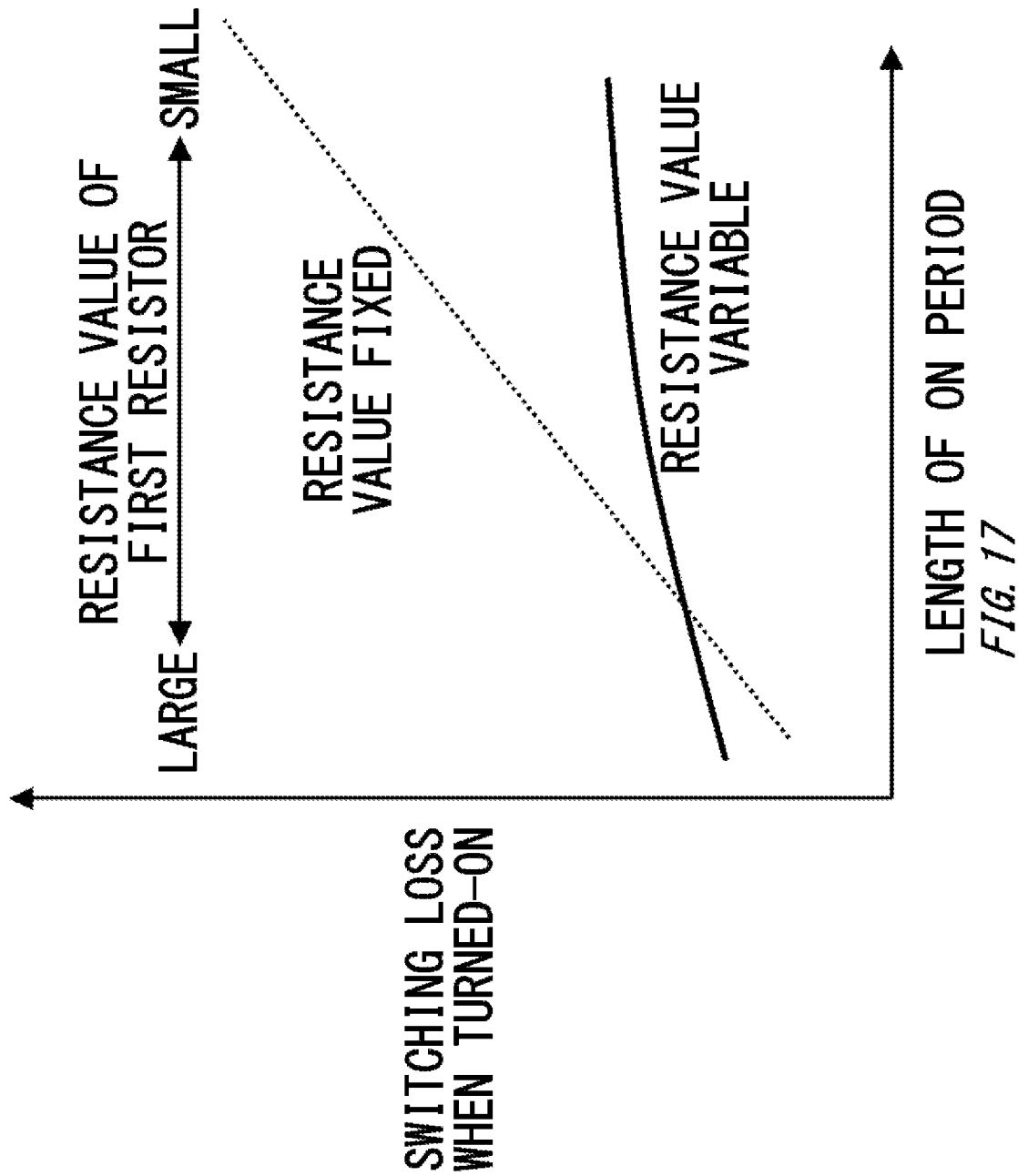
FIG. 17 shows the switching loss that occurs during the period during which the main switching device 2 is turned on when the resistance value is set as FIG. 15.

FIG. 17 shows the switching loss that occurs during the period during which the main switching device 2 is turned on when the resistance value is set as shown in FIG. 15. In the drawing, the horizontal axis indicates the length of the ON period of the main switching device 2 (or the magnitude of the opposite measurement target current during the opposite ON period, or the magnitude of the measurement target current during the ON period), and the vertical axis indicates the switching loss during the period during which the main switching device 2 is turned on. Also, in the drawing, the phrase "resistance value fixed" indicates the switching loss when the resistance value of the first resistor 63 is maintained in a constant value, and the phrase "resistance value variable" indicates the switching loss when the resistance value of the first resistor 63 is set as shown in FIG. 15. As shown in this drawing, when the resistance value is set as shown in FIG. 15, compared to the case where the resistance value is maintained in a constant value, the switching loss when the ON period is long and the opposite measurement target current (the current flowing through the freewheeling diode 3) is large is reduced.

3. Modified Example

Note that although in the above-described embodiments, the first resistor 63 and the second resistor 64 are respectively described as variable resistors, only either one thereof may be the variable resistor. In this case, the control circuits 67, 87 may change the resistance value of the variable resistor only of the first resistor 63 and the second resistor 64.

Also, although it is described that the control circuits 67, 87 continuously change the resistance value(s) of the first resistor 63 and/or the second resistor 64, the control circuits 67, 87 may stepwisely and discretely change the resistance value(s) by using one or more thresholds. As one example, the control circuit 67 may use, as a first resistance value, the resistance value of the second resistor 64 when the length of the ON period of the main switching device 2 is smaller than one threshold and may use, as a second resistance value that is larger than the first resistance value, the resistance value of the second resistor 64 when the length of the ON period is equal to or more than the one threshold.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A gate driving circuit that drives a gate of a main switching device, the gate driving circuit comprising:
   a first resistor that is connected between a first potential and the gate of the main switching device;
   a second resistor that is connected between a second potential lower than the first potential and the gate of the main switching device;
   a first switching device that is connected in series with the first resistor between the first potential and the gate of the main switching device;
   a second switching device that is connected in series with the second resistor between the second potential and the gate of the main switching device; and
   a control circuit that changes at least one resistance value of a resistance value of the first resistor and a resistance value of the second resistor according to a length of an ON period during which the main switching device is turned on.

2. The gate driving circuit according to claim 1, wherein the control circuit sets the resistance value of the second resistor to be larger when the ON period is a first period than when the ON period is a second period that is shorter than the first period.

3. The gate driving circuit according to claim 2, wherein at least one of the first resistor and the second resistor is a voltage-controlled resistor having a resistance value that is continuously changeable according to an input voltage, and
   as the ON period is longer within a predetermined range, the control circuit supplies a voltage that causes the resistance value to be large to the voltage-controlled resistor.

4. The gate driving circuit according to claim 3, wherein the voltage-controlled resistor has a field effect transistor that changes a resistance value between two main terminals according to a voltage input to a control terminal.

5. The gate driving circuit according to claim 1, wherein the control circuit sets the resistance value of the first resistor to be smaller when the ON period is a third period than when the ON period is a fourth period that is shorter than the third period.

6. The gate driving circuit according to claim 1, wherein the control circuit controls the first switching device and the second switching device according to an input control signal, and determines the length of the ON period according to a length of a specified period during which the main switching device is turned on by the control signal.

7. The gate driving circuit according to claim 6, wherein the control circuit sets the at least one resistance value during a current ON period according to a length of a previous or former ON period.

8. The gate driving circuit according to claim 6, wherein the control signal specifies the ON period by a pulse, and the control circuit sets the at least one resistance value according to a width of the pulse.

9. A switching power supply apparatus comprising
   the driving circuit according to claim 1;
   the main switching device; and
   a freewheeling diode connected with the main switching device in anti-parallel.

10. A gate driving circuit that drives a gate of a main switching device, the gate driving circuit comprising:
    a first resistor that is connected between a first potential and the gate of the main switching device;
    a second resistor that is connected between a second potential being lower than the first potential and the gate of the main switching device;
    a first switching device that is connected in series with the first resistor between the first potential and the gate of the main switching device;
    a second switching device that is connected in series with the second resistor between the second potential and the gate of the main switching device;
    a detecting section that detects a magnitude of measurement target current including current that flows through the main switching device during a period during which the main switching device is turned on; and
    a control circuit that changes at least one resistance value of a resistance value of the first resistor and a resistance value of the second resistor according to the detected magnitude of the measurement target current, wherein
    the control circuit sets the resistance value of the second resistor to be larger when the detected magnitude of the measurement target current is a first magnitude than when the detected magnitude of the measurement target current is a second magnitude that is smaller than the first magnitude, and
    the control circuit sets the resistance value of the second resistor during a current ON period according to the magnitude of the measurement target current measured during a previous ON period.

11. The gate driving circuit according to claim 10, wherein
    the control circuit sets the resistance value of the first resistor to be smaller when the detected magnitude of the measurement target current is a third magnitude than when the detected magnitude of the measurement target current is a fourth magnitude that is smaller than the third magnitude.

12. The gate driving circuit according to claim 10, wherein
    the detecting section samples a magnitude of the measurement target current at a predetermined timing during the period during which the main switching device is turned on.

13. A switching power supply apparatus comprising
    the driving circuit according to claim 10;
    the main switching device; and
    a freewheeling diode connected with the main switching device in anti-parallel.

14. A gate driving circuit that drives a gate of a main switching device, the gate driving circuit comprising:
    a first resistor that is connected between a first potential and the gate of the main switching device;
    a second resistor that is connected between a second potential being lower than the first potential and the gate of the main switching device;
    a first switching device that is connected in series with the first resistor between the first potential and the gate of the main switching device;
    a second switching device that is connected in series with the second resistor between the second potential and the gate of the main switching device;
    a detecting section that detects a magnitude of opposite measurement target current including current that flows from a negative-side main terminal side toward a positive-side main terminal side of an opposite switching device connected in series with the main switching device during a period during which the main switching device is turned off; and a control circuit that changes a resistance value of the first resistor according to the magnitude of the opposite measurement target current.

15. The gate driving circuit according to claim 14, wherein the detecting section further detects a magnitude of measurement target current including current that flows through the main switching device during a period during which the main switching device is turned on, and the control circuit further changes a resistance value of the second resistor according to the detected magnitude of the measurement target current.

16. The gate driving circuit according to claim 14, wherein the control circuit sets the resistance value of the first resistor to be smaller when the detected magnitude of the opposite measurement target current is a third magnitude than when the detected magnitude of the opposite measurement target current is a fourth magnitude that is smaller than the third magnitude.

17. The gate driving circuit according to claim 14, wherein the detecting section samples the magnitude of the opposite measurement target current at a predetermined timing during a period during which the opposite switching device is turned on.

18. A switching power supply apparatus comprising the gate driving circuit according to claim 14;

the main switching device; and a freewheeling diode connected with the main switching device in anti-parallel.

19. A gate driving circuit that drives a gate of a main switching device, the gate driving circuit comprising:

a first resistor that is connected between a first potential and the gate of the main switching device;

a second resistor that is connected between a second potential being lower than the first potential and the gate of the main switching device;

a first switching device that is connected in series with the first resistor between the first potential and the gate of the main switching device;

a second switching device that is connected in series with the second resistor between the second potential and the gate of the main switching device;

a detecting section that detects a magnitude of measurement target current including current that flows through the main switching device during a period during which the main switching device is turned on; and a control circuit that changes at least one resistance value of a resistance value of the first resistor and a resistance value of the second resistor according to the detected magnitude of the measurement target current, wherein the detecting section samples a magnitude of the measurement target current at a predetermined timing during the period during which the main switching device is turned on, the predetermined timing being set after a lapse of a certain time period from a falling of a control signal to the main switching device.

* * * * *